US012812822B2

(12) United States Patent
Watarai et al.

(10) Patent No.: US 12,812,822 B2
(45) Date of Patent: Nov. 24, 2026

(54) ELECTRONIC CONTROLLER

(71) Applicant: HITACHI ASTEMO, LTD., Hitachinaka (JP)

(72) Inventors: Michihito Watarai, Hitachinaka (JP); Masato Saito, Hitachinaka (JP)

(73) Assignee: HITACHI ASTEMO, LTD., Hitachinaka (JP)

( * ) Notice: Subject to any disclaimer, the term of this patent is extended or adjusted under 35 U.S.C. 154(b) by 288 days.

(21) Appl. No.: 18/834,774

(22) PCT Filed: Mar. 31, 2022

(86) PCT No.: PCT/JP2022/016578
§ 371 (c)(1),
(2) Date: Jul. 31, 2024

(87) PCT Pub. No.: WO2023/188289
PCT Pub. Date: Oct. 5, 2023

(65) Prior Publication Data
US 2025/0142790 A1 May 1, 2025

(51) Int. Cl.
H05K 7/20 (2006.01)

(52) U.S. Cl.
CPC ..... H05K 7/20863 (2013.01); H05K 7/20145 (2013.01)

(58) Field of Classification Search
CPC ........... H05K 7/20863; H05K 7/20145; H05K 7/20409; H05K 7/20854; H05K 7/20172;
(Continued)

(56) References Cited

U.S. PATENT DOCUMENTS 5,615,998 A * 4/1997 Kodama ............... H10W 40/43 415/177
6,094,347 A * 7/2000 Bhatia ..................... G06F 1/203 361/679.55
(Continued)

FOREIGN PATENT DOCUMENTS

JP H11-219235 A 8/1999
JP 2002-366259 A 12/2002
JP 2018-206964 A 12/2018

OTHER PUBLICATIONS

English translation of International Preliminary Report on Patentability issued in corresponding International Application No. PCT/JP2022/016578, dated Oct. 10, 2024 (6 pages).
(Continued)

*Primary Examiner* — Mandeep S Buttar
(74) *Attorney, Agent, or Firm* — Foley & Lardner LLP

(57) ABSTRACT

An electric controller includes: a circuit board (7); a housing (2) that houses the circuit board (7); a plurality of radiation fins (21*a*) formed on the housing (2); an air duct (4) attached to the housing (2) in such a way as to cover the plurality of radiation fins (21*a*); a fan (8) that is held between the housing (2) and the air duct (4) and that sends cooling air to a channel formed by the plurality of radiation fins (21*a*); a fan connector (8*a*) electrically connected to the fan (8) via cables (8*c*); and a feeder connector (7*b*) electrically connected to the circuit board (7) and fixed to the housing. The fan connector (8*a*) is detachably connected to the feeder connector (7*b*), and the fan (8) and the fan connector (8*a*) are fixed to the air duct (4).

17 Claims, 18 Drawing Sheets

(58) Field of Classification Search
CPC ............. H05K 7/20154; H05K 1/0203; H05K 7/20272; H05K 7/20418; H05K 7/20509; H05K 7/20972; H05K 5/0217; G06F 1/20
See application file for complete search history.

(56) References Cited

U.S. PATENT DOCUMENTS

| | | | | |
|---|---|---|---|---|
| 6,637,502 | B1 * | 10/2003 | North | H10W 40/43<br>165/185 |
| 2004/0027798 | A1 | 2/2004 | Fujiwara | |
| 2021/0306538 | A1 * | 9/2021 | Solar | B60R 11/04 |
| 2023/0292470 | A1 * | 9/2023 | Ueno | H05K 7/20127 |
| 2024/0132003 | A1 * | 4/2024 | Selvaraj | B60R 16/0239 |

OTHER PUBLICATIONS

International Search Report with English Translation and Written Opinion of International Patent Application No. PCT/JP2022/016578 dated Jun. 28, 2022 (9 pages).

* cited by examiner

ELECTRONIC CONTROLLER

TECHNICAL FIELD

The present invention relates to an electronic controller.

BACKGROUND ART

As development of an autonomous driving ECU (Electronic Control Unit) and an integrated ECU progresses, the higher performance of ECUs has resulted in increasing heat generation by the ECUS. Consequently, a housing of an electronic controller now needs a cooling structure with performance higher than that of a conventional cooling structure. When the amount of heat generated by electronic components exceeds 10 W, in particular, forced air cooling is an essential means for cooling. Thus, an electronic controller equipped with a fan has been developed (e.g., Patent Literature 1).

CITATION LIST

Patent Literature

PTL 1: JP 2018-206964 A

SUMMARY OF INVENTION

Technical Problem

A process of mounting the fan on the electronic controller of Patent Literature 1 is very complicated. For example, to ensure its waterproof performance, the fan needs to be attached to a fan attachment opening formed on the wall of a case, using a sealing material. In addition, a terminal of the fan needs to be inserted into a hole (through-hole) formed on a circuit board and soldered to the circuit board.

Because the resulting structure is a structure in which the vibration of the fan is directly transmitted to solder electrically connecting the terminal of the fan to the circuit board, there is a concern that a contact failure may occur at the solder serving as a connection member between the terminal of the fan and the circuit board because of fine sliding wear of the solder.

An object of the present invention is to provide an electronic controller that can achieve an improvement in assembly work efficiency and an improvement in the reliability of electrical connections.

Solution to Problem

In order to achieve the above object, an electric controller of the present invention includes: a circuit board; a housing that houses the circuit board; a plurality of radiation fins formed on the housing; an air duct attached to the housing in such a way as to cover the plurality of radiation fins, the air duct forming a channel for cooling air together with the housing and the plurality of radiation fins; a fan that causes cooling air to flow through the channel; a fan connector electrically connected to the fan via a cable; and a feeder connector electrically connected to the circuit board and fixed to the housing. The fan connector is detachably connected to the feeder connector, and the fan and the fan connector are fixed to the air duct.

Advantageous Effects of Invention

According to the present invention, an improvement in assembly work efficiency and an improvement in the reliability of electrical connections can be achieved. Problems, configurations, and effects other than those described above will be made clear by the following description of embodiments.

DESCRIPTION OF EMBODIMENTS

Hereinafter, configurations and operations of electronic controllers according to first to fifth embodiments of the present invention will be described with reference to the drawings.

First Embodiment

Figure 1:
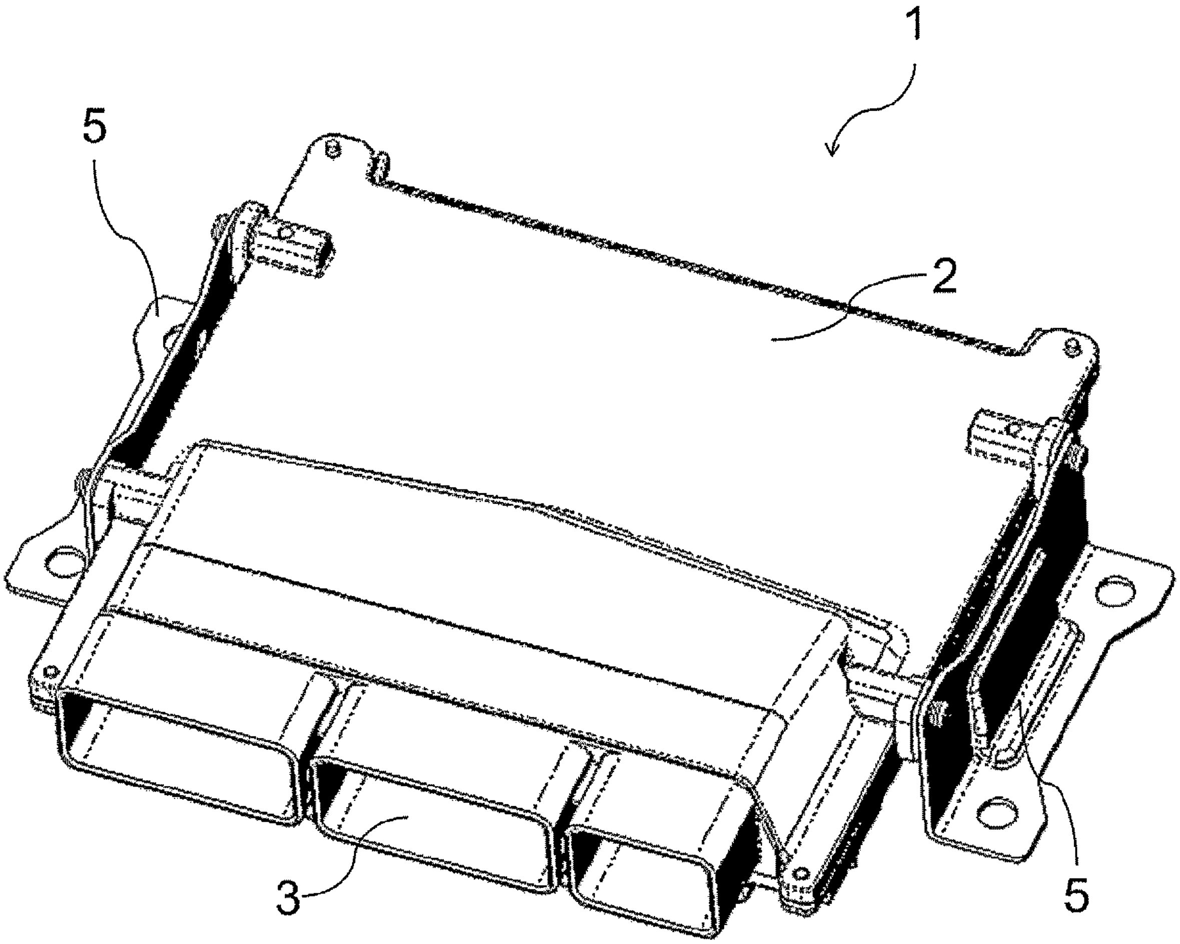
FIG. 1 is a perspective view of an electronic controller according to a first embodiment of the present invention, showing the electronic controller seen from its housing side.
Figure 2:
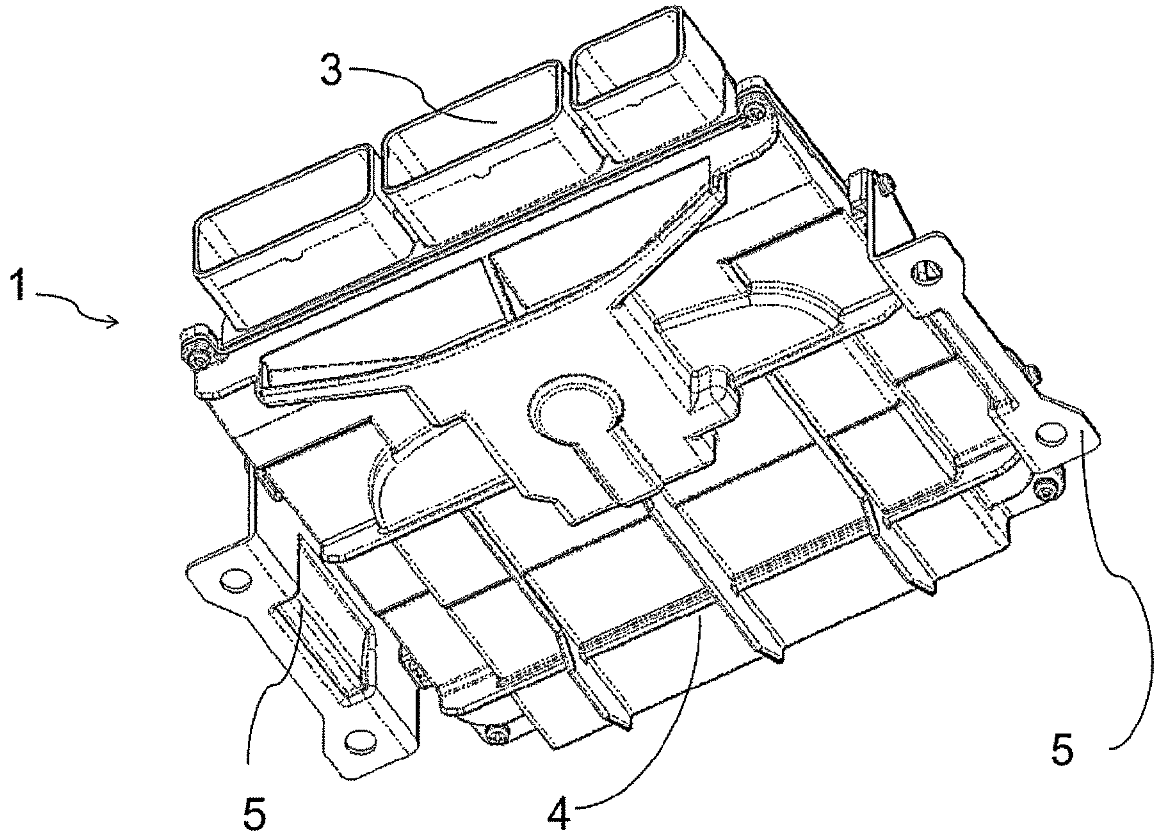
FIG. 2 is a perspective view of an electronic controller according to the first embodiment of the present invention, showing the electronic controller seen from its air duct side.

FIG. 1 is a perspective view of an electronic controller 1 according to a first embodiment of the present invention, showing the electronic controller 1 seen from its housing side. FIG. 2 is a perspective view of the electronic controller 1 according to the first embodiment of the present invention, showing the electronic controller seen from its air duct side.

The electronic controller 1, which is a type of computer, is an electronic control unit (ECU) that is incorporated in an automobile by being mounted to its structure. The electronic controller 1 is mounted to, for example, an engine room of the automobile.

As shown in FIGS. 1 and 2, the electronic controller 1 includes a housing 2, an external connection connector 3, an air duct 4, and brackets 5. The housing 2 is a component that houses a circuit board 7 to be described later, and includes a base 21 and a cover 22. The external connection connector 3 is a component that electrically connects an external terminal (not illustrated) to the electronic controller 1. The air duct 4 is a component that is attached to the housing 2 and that forms channels for cooling air between the air duct 4 and the housing 2. The brackets 5 are components for attaching the electronic controller 1 to a structure of the automobile, e.g., the engine room or the vehicle interior.

Figure 3:
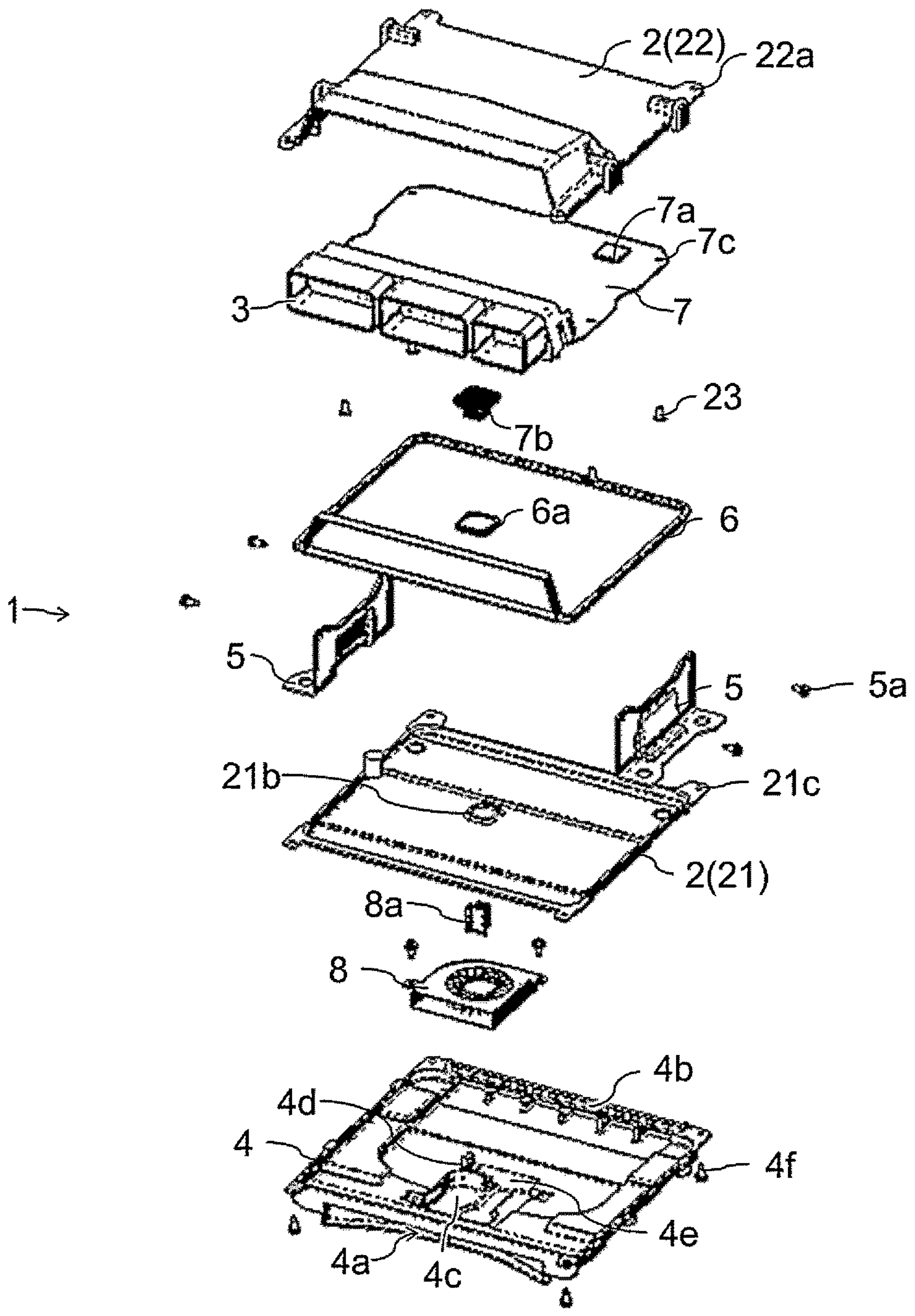
FIG. 3 is a developed perspective view of the electronic controller according to the first embodiment of the present invention.

FIG. 3 is a developed perspective view of the electronic controller 1 according to the first embodiment of the present invention. As shown in FIG. 3, the electronic controller 1 can be disassembled into a base 21, a cover 22, a sealing material 6, the circuit board 7 (including the external connection connector 3), the air duct 4, a fan 8, and the brackets 5.

The base 21 is one of components making up the housing 2, and is formed of, for example, an aluminum plate material or die-cast aluminum. On the back of a surface of the base 21 that bears the circuit board 7, a plurality of radiation fins 21*a* (see FIG. 4) are provided.

The plurality of radiation fins 21*a* are formed by, for example, skiving (slice-cutting the surface layer to raise a sliced part with its base bent (scraping)). The plurality of radiation fins 21*a* may be formed by casting.

The base 21 is provided with a rectangular through-hole 21*b* that allows a feeder connector 7*b* fixed to the circuit board 7 to project toward the fan connector 8*a*.

The cover 22 is one of components making up the housing 2 and is a component that covers the circuit board 7. The circuit board 7 is attached to the cover 22 with, for example, a screw 23. The cover 22 and the base 21 are fitted together with screws 4*f* or the like for attaching the air duct 4, which will be described later, to the cover 22, thus forming the housing 2 that houses the circuit board 7.

As a material making up the cover 22, for example, a resin like polybutylene terephthalate (PBT), polyphenylene sulfide (PPS), or nylon (PA) may be used, in which case the weight of the cover 22 can be reduced. A metal, such as aluminum or iron, may be used as the material to improve the cooling performance or rigidity of the cover 2.

The sealing material 6 is a component for waterproofing the housing 2. It is preferable, for example, that the sealing material 6 be sandwiched between the base 21 and the cover 22. As the sealing material 6, for example, an adhesive made of a silicon-based material, an epoxy-based material, or a urethane-based material or an O-ring made of a rubber-based material can be used.

The circuit board 7 is a printed board, on which an electronic component 7*a*, the external connection connector 3, and the feeder connector 7*b*, which will be described later, are electrically connected to holes (through-holes) formed on the circuit board 7, by soldering, press fitting, spot flow, or the like. The circuit board 7 is provided with a through-hole 7*c*, and is fixed to the cover 22 with a screw 23 or the like inserted into the through-hole 7*c*.

The electronic component 7*a*, which is a component making up an electronic circuit, is an integrated circuit carrying a package of heat-generating elements like semiconductor elements, such as a ball grid array (BGA) or a quad flat package (QFP).

The external connection connector 3 is made of resin, such as polybutylene terephthalate (PBT), polyamide (PA), or polyphenylene sulfide (PPS). The external connection connector 3 has a plurality of connector terminals made mainly of a copper-based metal, and is connected to a connector (not illustrated) on the front end of a harness extending from a communication counterpart device on the automobile side. The connector terminal is a terminal for supplying and receiving voltage and current to and from a connection counterpart, and is electrically connected to an electronic circuit formed on the circuit board 7, via a cable.

The external connection connector 3 is exposed from the housing. It is preferable that the sealing material 6 be sandwiched between the external connection connector 3 and base 21 and the cover 22 to prevent water infiltration. Thus, the periphery of the external connection connector 3 is waterproofed with the sealing material 6.

The feeder connector 7*b* is a connector for supplying power to the fan 8, and is attached to, for example, the back of a surface of the circuit board 7 that bears the electronic component 7*a*.

The air duct 4 is a component that is attached to the housing 2 in such a way as to cover the plurality of radiation fins 21*a* formed on the base 21 and that forms a channel for cooling air (which will hereinafter be referred to as a cooling air channel in some cases), together with the housing 2 and the plurality of radiation fins 21*a*. The air duct 4 is fixed to the housing 2 with the screws 4*f*. The cooling air channel is formed along the plurality of radiation fins 21*a*.

The air duct 4 is provided with openings 4*a* and 4*b* for taking in and discharging cooling air, a fan fixing portion 4*c*, which is a recession in which the fan 8 is fitted (fixed), a connector fixing portion 4*d*, which is a recession in which the fan connector 8*a* is fitted (fixed), and a cable storage portion 4*e*, which is a recession in which a cable is stored. The air duct 4 is formed of resin, such as polybutylene terephthalate (PBT), polyphenylene sulfide (PPS), or nylon (PA), or of die-cast aluminum. For this reason, the fan fixing portion 4*c* and the connector fixing portion 4*d* can be easily molded in conformity to the shapes of the fan 8 and the fan connector 8*a* to be fixed.

The fan 8 is a component that causes a gas to flow in the cooling air channel, and is fixed to the air duct 4 and electrically connected to the fan connector 8*a*. As the fan 8, for example, a thin blower fan with an aluminum die-cast frame or resin frame can be used. Because the fan fixing portion 4*c* of the air duct 4 can be easily molded in conformity to the shape of the fan 8 to be fixed, the fan 8 may be provided as a general-purpose product, in which case cost can be reduced.

Figure 9:
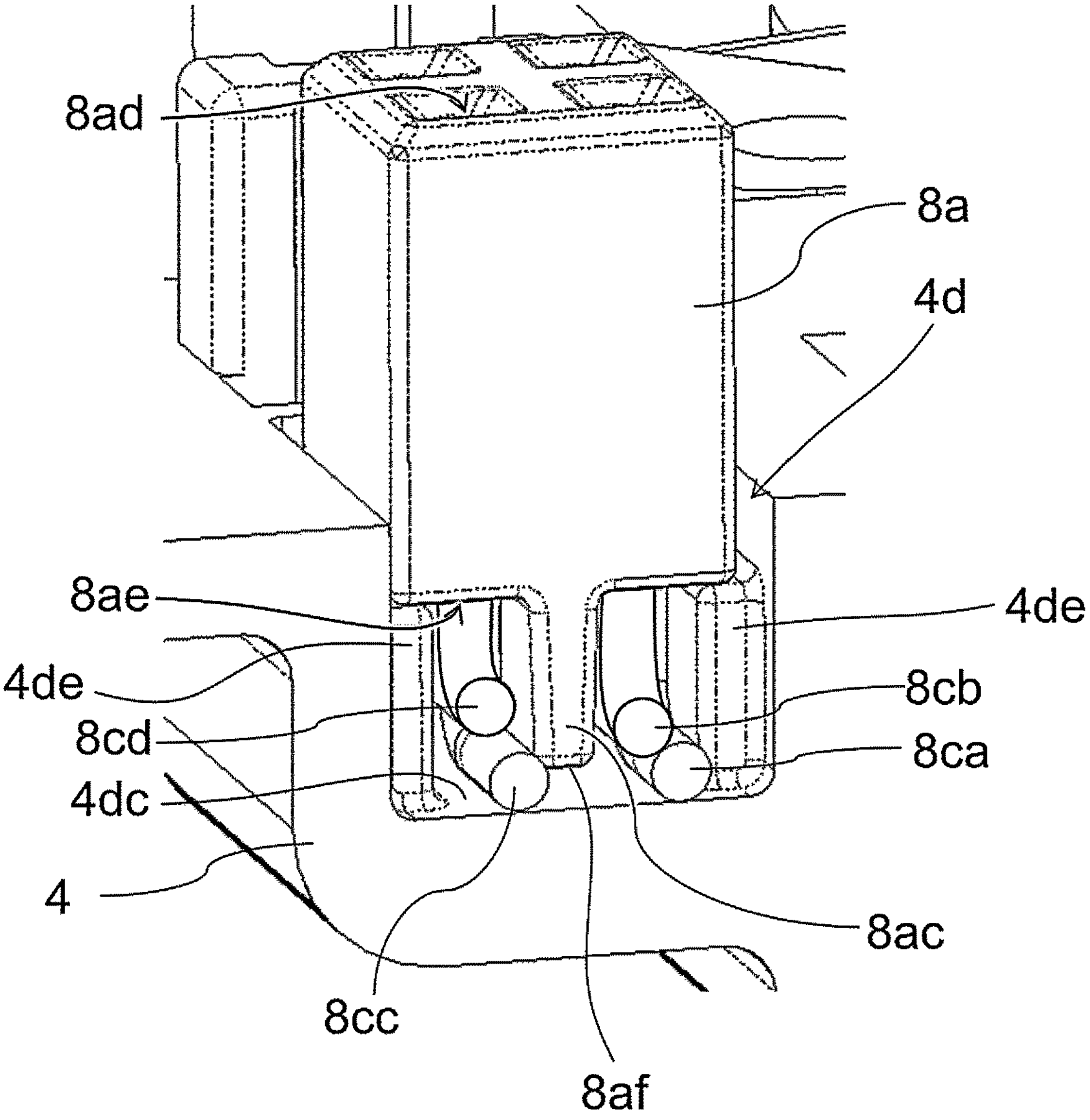
FIG. 9 is a perspective view of a section taken along a line B-B in FIG. 8.

The fan connector 8*a* is an electric component detachably connected to the feeder connector 7*b*. The fan connector 8*a* is fixed to the air duct 4, is electrically connected to the feeder connector 7*b*, and supplies power to the fan 8 via cables 8*c*. The fan connector 8*a* is formed of resin, such as polybutylene terephthalate (PBT), polyamide (PA), or polyphenylene sulfide (PPS), and has a plurality of built-in female terminals made mainly of copper. As shown in FIG. 9, which will be referred to later, one end face of the fan connector 8*a* is provided with a plurality of openings 8*ad* communicating with the plurality of female terminals so that fan-side terminals 7*bb* (see FIG. 10) of the feeder connector 7*b* can be inserted into the plurality of female terminals inside the fan connector 8*a*. The cables 8*c* are electrically connected respectively to the plurality of female terminals and are led out of the other end face of the fan connector 8*a*. Because the connector fixing portion 4*d* of the air duct 4 can be easily molded in conformity to the shape of the fan connector 8*a* to be fixed, the fan connector 8*a* may be provided as a general-purpose product, in which case the cost can be reduced.

Fixing the fan 8 and the fan connector 8*a* to the air duct 4 forms an assembly, which is referred to as a subassembly 48. The subassembly 48 is attached to the housing 2, forms the cooling air channel between the subassembly 48 and the housing 2, and causes a gas to flow through the channel when the fan 8 supplied with current runs.

The brackets 5 are components for fixing the electronic controller 1 to the vehicle, and are attached to the housing 2 with, for example, screws 5*a*. The brackets 5 may be molded integrally with the housing 2.

Figure 4:
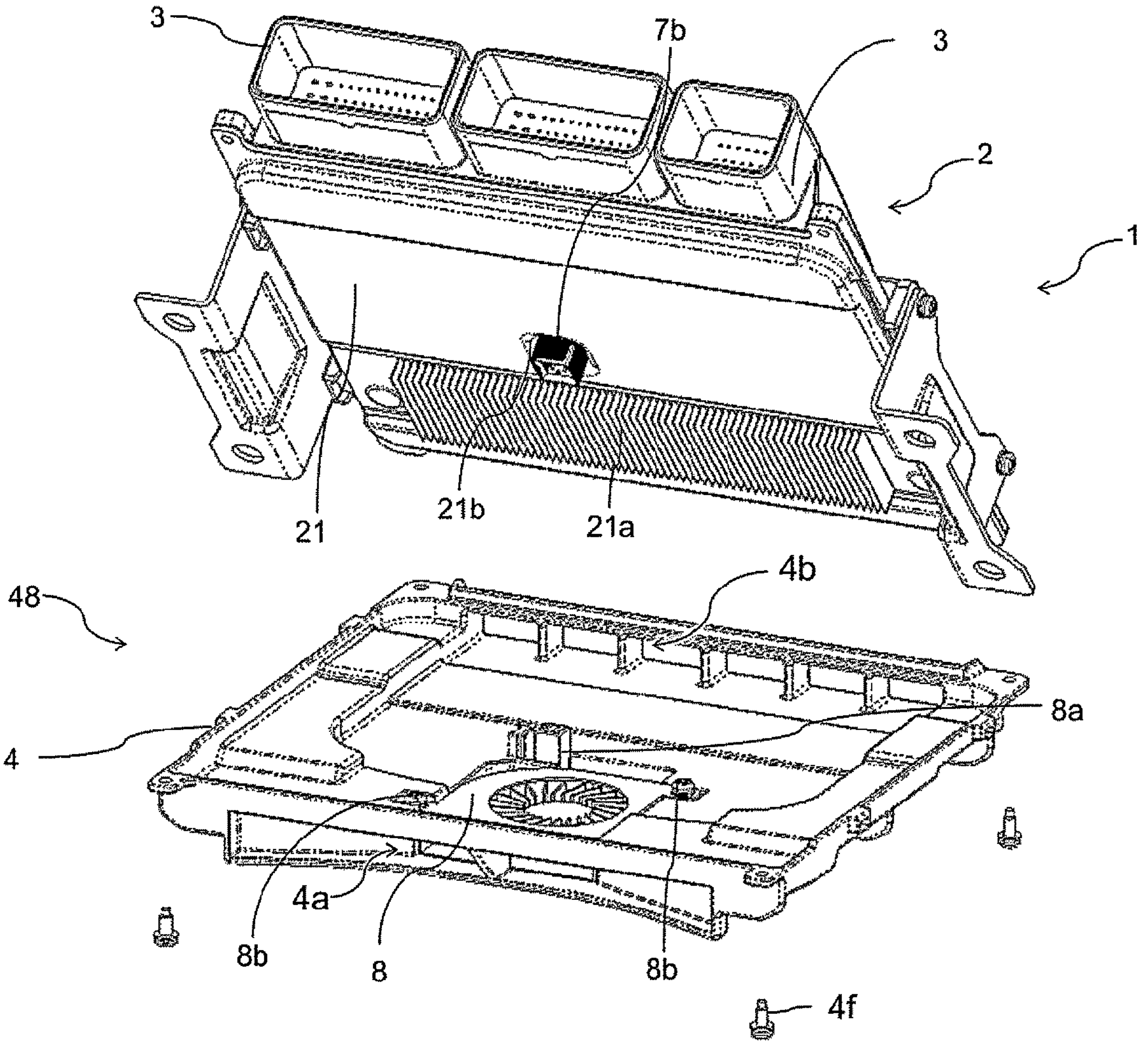
FIG. 4 is a perspective view showing a state in which a subassembly is removed from the electronic controller according to the first embodiment of the present invention.

FIG. 4 is a perspective view showing a state in which the subassembly 48 is removed from the electronic controller 1 according to the first embodiment of the present invention. In a state where the subassembly 48 is attached to the housing 2, the fan 8 is located downstream to the plurality of radiation fins 21*a* in the cooling air channel and is fixed to the air duct 4 with, for example, screws 8*b*. In the vicinity of the fan 8 fixed to the air duct 4, the fan connector 8*a* is fixed to the air duct 4. When the subassembly 48 is attached to the housing 2, the fan connector 8*a* in the subassembly 48 is fitted to the feeder connector 7*b* projecting from a through-hole 21*b* of the base 21 toward the air duct 4 and is electrically connected to the feeder connector 7*b*.

Figure 5:
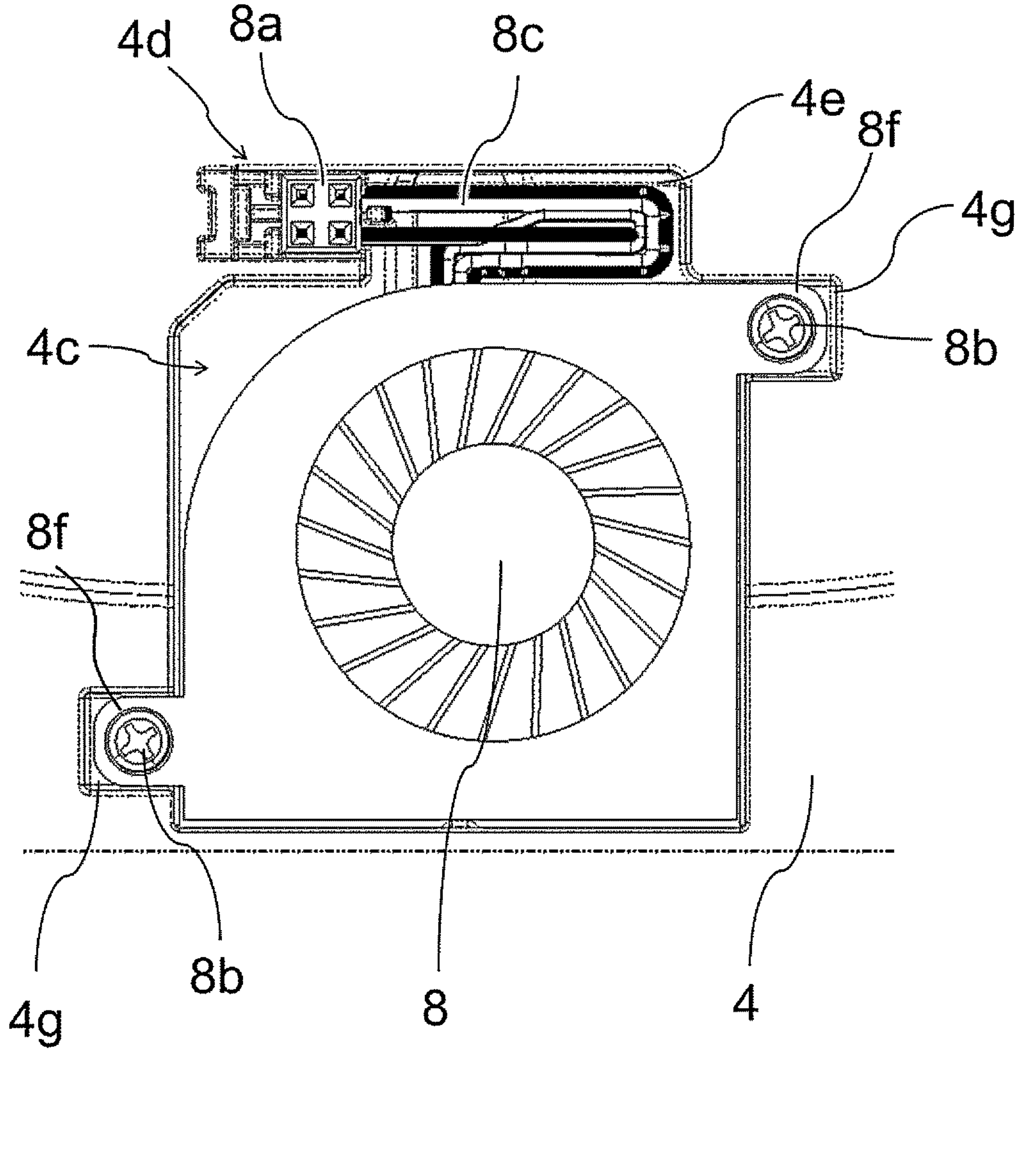
FIG. 5 is an enlarged view of a fan and a fan connector that are attached to the air duct according to the first embodiment of the present invention.

FIG. 5 is an enlarged view of the fan 8 and the fan connector 8*a* that are attached to the air duct 4 according to the first embodiment of the present invention As shown in FIG. 5, the fan 8 and the fan connector 8*a* are electrically connected to each other via the cables 8*c*. It is preferable that each cable 8*c* be longer than the distance (linear distance) between a connection part of fan 8 that is connected to the cable 8*c* and a connection part of fan connector 8*a* that is connected to the cable 8*c* (that is, providing the cable 8*c* with an extra length part is preferable), and that, for example, the cable 8*c* be set such that its wiring path is curved in a substantially U shape, as shown in FIG. 5. Considering this point and the standard size of the electronic controller for use in the vehicle gives a conclusion that the length of the cable 8*c* should preferably be 5 cm to 15 cm.

It is also preferable that, as described above, the electronic controller 1 include the sealing material 6 disposed between the base 21 and the cover 22 that make up the housing 2 and between a set of the base 21 and the cover 22 and the external connection connector 3. It is also preferable that a sealing material 6*a* be disposed in a gap formed between the through-hole 21*b* of the base 21 and the feeder connector 7*b*. It is also preferable that a potting material be applied to an electrical connection part between the fan connector 8*a* and the cables 8*c*. It is also preferable that the fan 8 be a waterproof fan. These configurations make the electronic controller 1 waterproof. It should be noted that the electronic controller 1 can be selectively made waterproof or dust-proof, depending on whether or not to use the sealing materials 6 and 6*a*, the potting material, and the waterproof fan, and that the type of the electronic controller 1 can be easily changed according to a location where the electronic controller 1 is installed.

It is preferable that the air duct 4 be provided with a cable storage portion 4*e* in which a surplus part (extra length part) of the cable 8*c* is stored. It is also preferable that the air duct 4 be provided with an attachment surface limiting structures 4*g* that limit an attachment surface of the fan 8 (i.e., a surface of the fan 8 that faces the air duct 4 when the fan 8 is attached to the air duct 4). The attachment surface limiting structures 4*g* limit the attachment surface in accordance with the shape of the fan 8. As shown in FIG. 5, screw fitting portions 8*f*, to which the screws 8*b* are fitted, are formed on side surfaces of the fan 8, respectively, and the positions of these two screw fitting portions 8*f* on the fan 8 are not linearly symmetric with each other. The attachment surface limiting structures 4*g* of this embodiment are two recesses formed on the air duct 4 so that the shapes of the two screw fitting portions 8*f* are placed in the recesses when the correct attachment surface of the fan 8 (the attachment surface on which the flow direction of cooling air generated by the fan 8 is a designed direction) is located on the air duct 4 side. Thus, in a case where the two screw fitting portions 8*f* are placed in the two attachment surface limiting structures 4*g* when the fan 8 is attached to the air duct 4, the fan 8 is attached to the air duct 4 in the correct direction.

Figure 6:
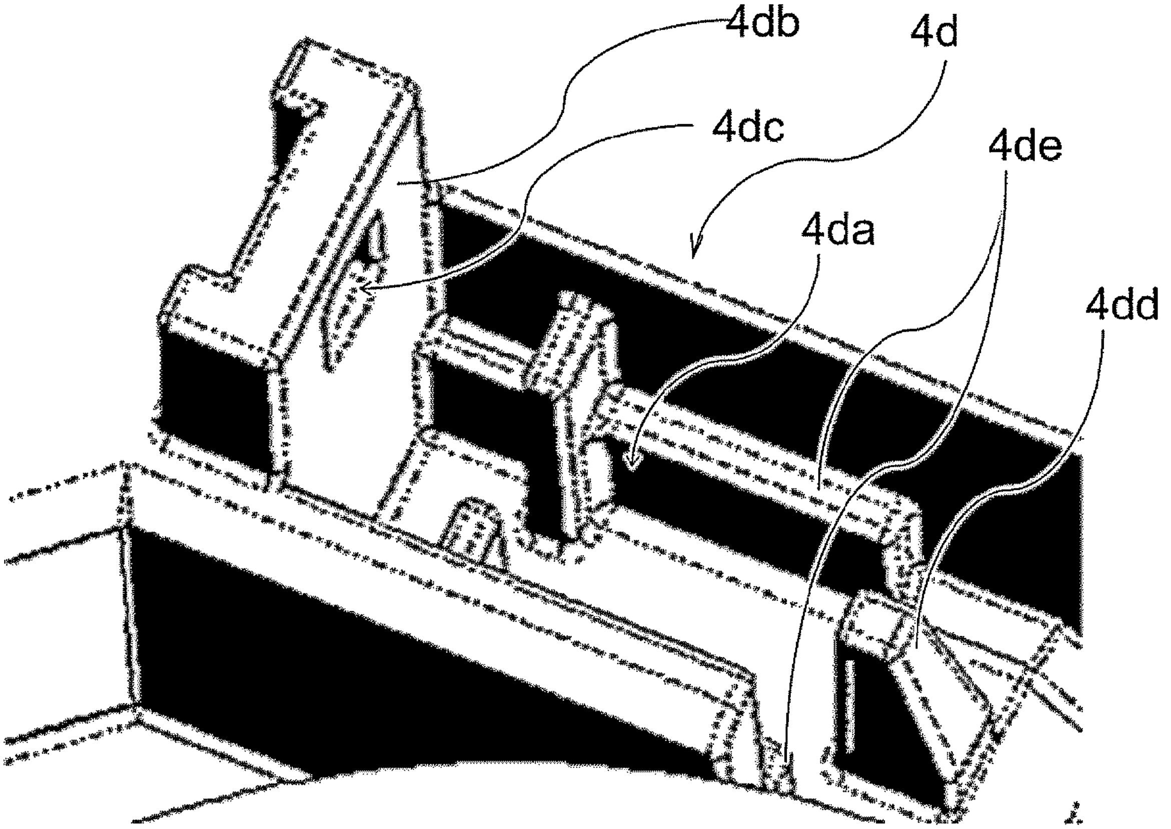
FIG. 6 is an enlarged perspective view of a connector fixing portion formed on the air duct according to the first embodiment of the present invention.

FIG. 6 is an enlarged perspective view of the connector fixing portion 4*d* formed on the air duct 4 according to the first embodiment of the present invention. As shown in FIG. 6, the air duct 4 is provided with the connector fixing portion 4*d* for fixing the fan connector 8*a*. It is preferable that, as shown in FIG. 6, the connector fixing portion 4*d* be provided with a slot 4*da* into which the fan connector 8*a* is inserted, a latch engagement part 4*db* having a latch receiver 4*dc*, a boss 4*dd* that prevents the fan connector 8*a* from moving to the opposite side of the latch engagement part 4*db*, and a pair of supports 4*de* that support the fan connector 8*a*.

Figure 7:
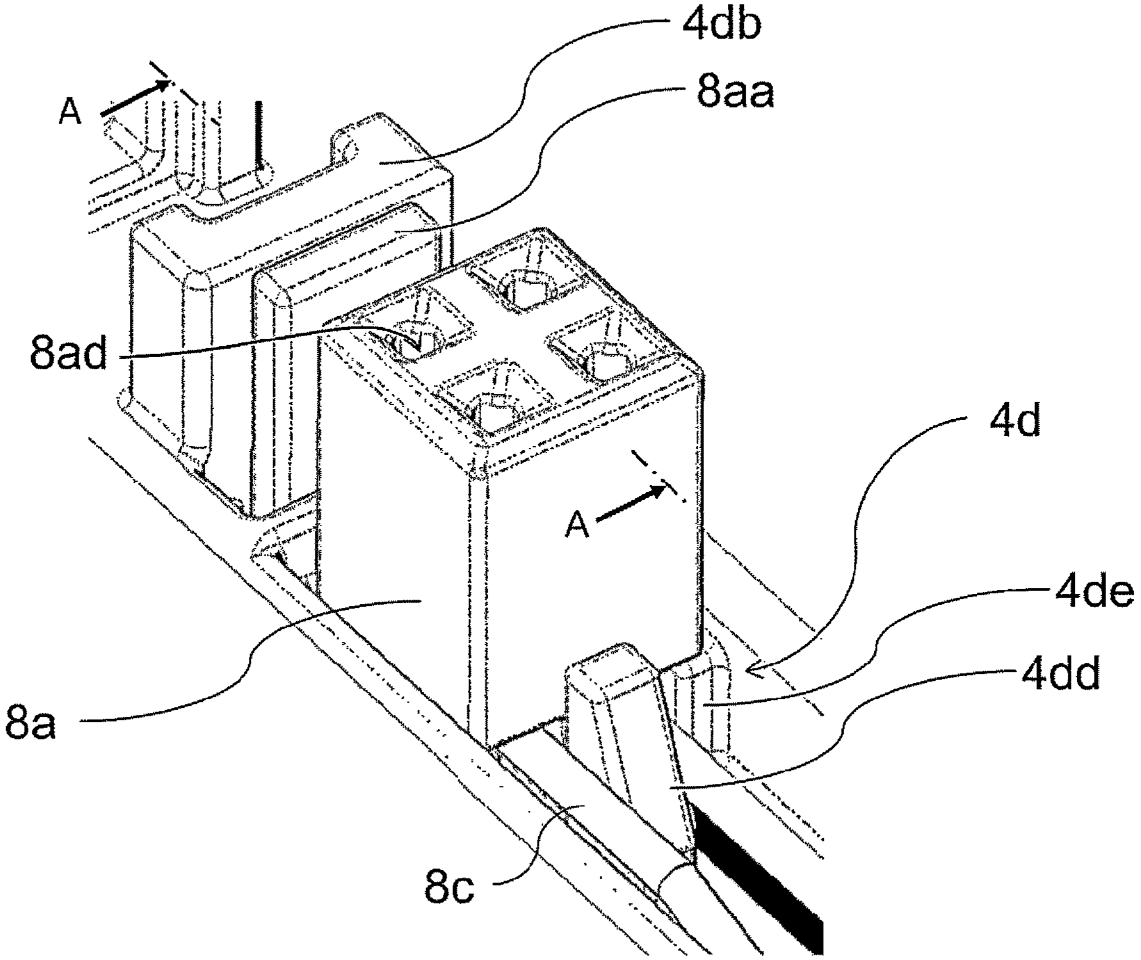
FIG. 7 is an enlarged perspective view of the fan connector fitted to the connector fixing portion of the air duct according to the first embodiment of the present invention.
Figure 8:
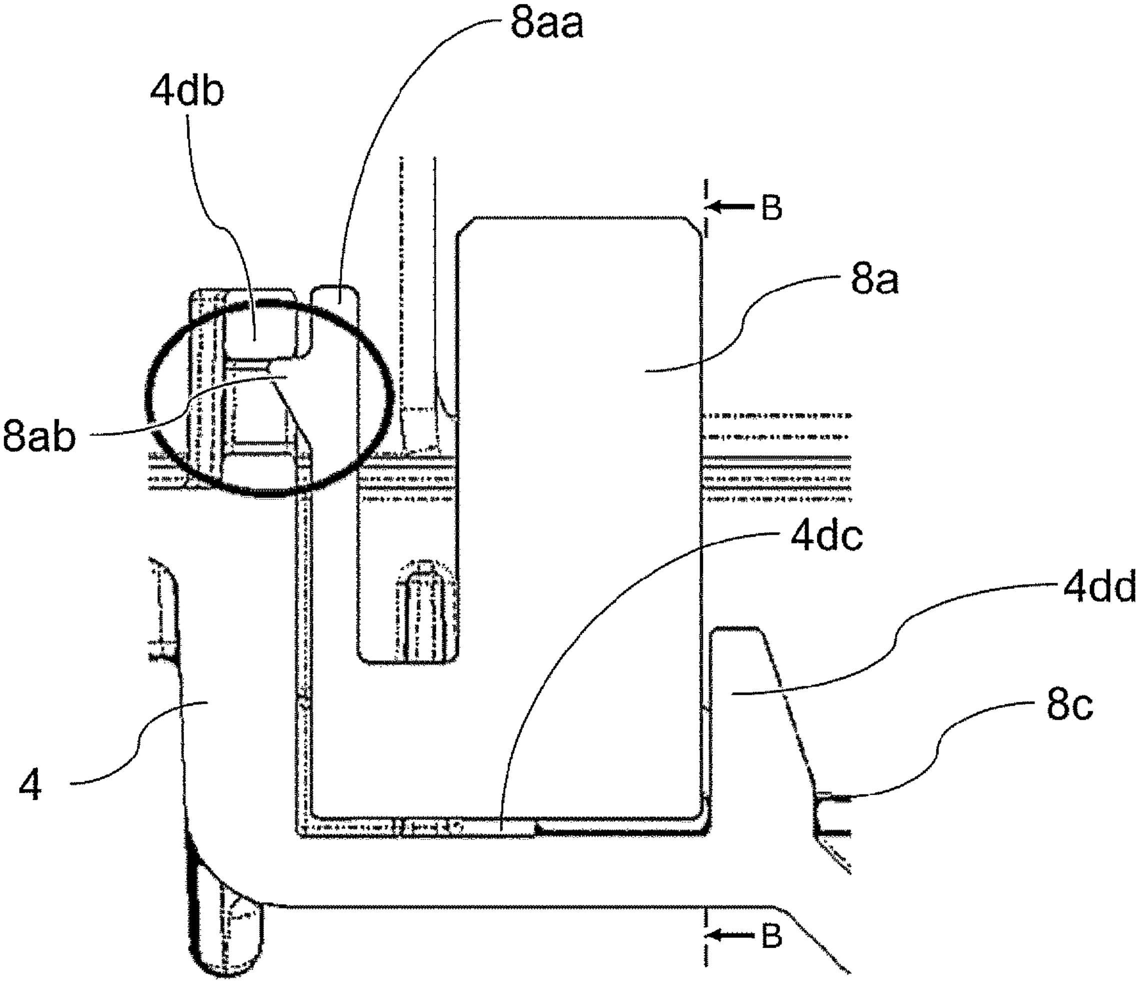
FIG. 8 is a sectional view taken along a line A-A in FIG. 7.

FIG. 7 is an enlarged perspective view of the fan connector 8*a* fitted to the connector fixing portion 4*d* of the air duct 4 according to the first embodiment of the present invention, and FIG. 8 is a sectional view taken along a line A-A in FIG. 7. The section along the line A-A passes through the center of the fan connector 8*a*.

As shown in FIG. 7, on the fan connector 8*a*, an end surface having openings 8*ad* faces upward as an end surface from which the cables 8*c* are led out is inserted into the slot 4*da*. It is preferable that, as shown in FIG. 8, the fan connector 8*a* be provided with a latch locking part 8*aa* having a claw 8ab that is locked to the latch receiver 4dc when the fan connector 8a is inserted into the slot 4da, the latch locking part 8aa being of a leaf spring shape. The latch locking part 8aa and the latch engagement part 4db jointly form a latch mechanism. It is preferable that the fan connector 8a inserted into the slot 4da of the connector fixing portion 4d and the air duct 4 be coupled to each other by the latch mechanism. It is preferable that the fan connector 8a inserted into the slot 4da of the connector fixing portion 4d be prevented by the boss 4dd from moving to the opposite side of the latch engagement part 4db and that the claw 8ab locked to the latch receiver 4dc do not come off from the latch receiver 4dc.

FIG. 9 is a perspective view of a section taken along a line B-B in FIG. 8. As shown in FIG. 9, the fan connector 8a inserted into the slot 4da comes in contact with the pair of supports 4de of the connector fixing portion 4d and is supported by the supports 4de. It is preferable that a bottom surface Bae of the fan connector 8a in contact with the pair of supports 4de (i.e., a surface of the fan connector 8a that is closer to the slot 4da) be provided with a projection 8ac projecting toward a bottom surface 4dc along the slot 4da. It is preferable that the plurality of cables 8c led out of the bottom surface 8ae be arranged along the slot 4da by the projection 8ac . . . . In the example of FIG. 9, four cables 8c (cables 8ca to 8cd) are led out of the bottom surface 8ae of the fan connector 8a, and the cables 8cc and 8cd are arranged along the slot 4da on the left side of the projection 8ac as the cables 8ca and 8cb are arranged along the slot 4da on the right side of the projection 8ac.

To arrange the plurality of cables 8c along the slot 4da by the projection Bac and insert the claw 8ab securely into the latch receiver 4dc, a gap smaller than the wire diameter of the cable 8c is formed between the front end of the projection 8ac and the bottom surface 4dc of the slot 4da. In this embodiment, the wire diameter of the cable 8c is 0.9 mm, and the gap between the front end of the projection 8ac and the bottom surface 4dc of the slot 4da is 0.5 mm. Because the gap is formed between the front end of the projection 8ac and the bottom surface 4dc of the slot 4da, the fan connector 8a comes in contact with the pair of supports 4de of the connector fixing portion 4d and is supported by the supports 4de. When, because of a manufacturing error or the like, the fan connector 8a is inserted into the slot 4da without coming in contact with the pair of supports 4de of the connector fixing portion 4d, however, the front end of the projection 8ac comes in contact with the bottom surface 4dc of the slot 4da. This prevents a case where the cables 8c are sandwiched between the bottom surface 8ae of the fan connector 8a and the bottom surface 4dc of the slot 4da.

It is preferable that the electronic controller 1 of this embodiment further include a temperature sensor and that the rotating speed of the fan 8 be controlled based on a detection value from the temperature sensor. It is preferable, for example, that the electronic controller 1 include a temperature sensor incorporated in the electronic component 7a and that the rotation speed of the fan 8 be controlled based on a detection value from the temperature sensor incorporated in the electronic component 7a (that is, the temperature of an area around the electronic component 7a). It is also possible that the temperature sensor is mounted on the circuit board 7 and that the rotating speed of the fan 8 is controlled based on a detection value from the temperature sensor (that is, the temperature of an area around the temperature sensor mounted on the circuit board 7). It is preferable that the cables 8c, i.e., the plurality of cables 8c include the cable 8cc through which a rotating speed instruction (e.g., a PWM signal) to the fan 8 is transmitted and the cable 8cd through which a detection signal from a rotating speed sensor attached to the fan 8 is transmitted.

Specifically, it is preferable that, as shown in FIG. 9, the plurality of cables 8c include four cables 8c (a positive line (red) 8ca, a negative line (black) 8cb, a PWM line (blue) 8cc, a pulse line (yellow) 8cd). The positive line (red) 8ca and the negative line (black) 8cb are the cables 8c for supplying current to the fan 8.

Figure 10:
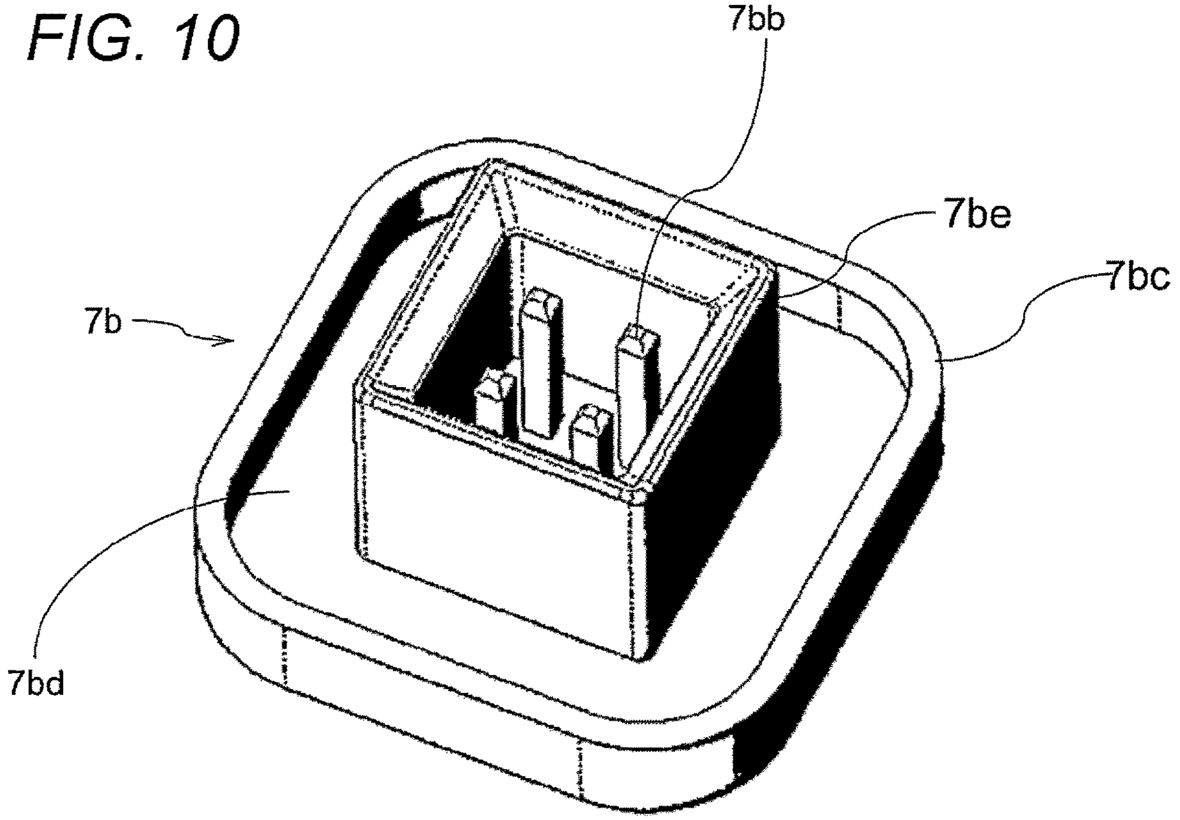
FIG. 10 is a perspective view a feeder connector according to the first embodiment of the present invention.
Figure 11:
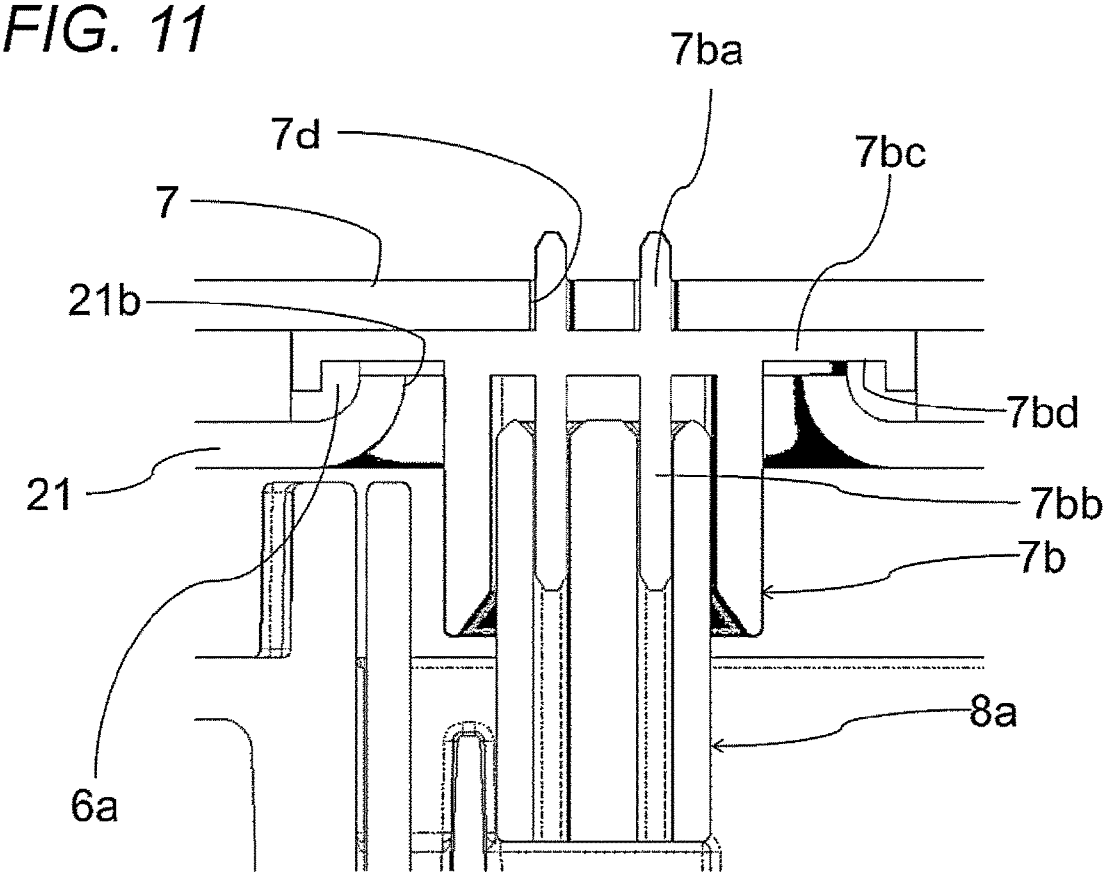
FIG. 11 is an enlarged sectional view of a fitting part where the feeder connector and the fan connector are fitted together in the electronic controller according to the first embodiment of the present invention.

FIG. 10 is a perspective view of the feeder connector 7b according to the first embodiment of the present invention. FIG. 11 is an enlarged sectional view of a fitting part where the feeder connector 7b and the fan connector 8a are fitted together in the electronic controller 1 according to the first embodiment of the present invention. It is preferable that, as shown in FIG. 11, the feeder connector 7b be attached to the circuit board 7. It is also preferable that the feeder connector 7b be inserted into the through-hole 21b formed on the housing 2 (the base 21 in this embodiment) and that the sealing material 6a be disposed in the gap formed between the through-hole 21b and the feeder connector 7b.

Specifically, it is preferable that the feeder connector 7b include board-side terminals 7ba (see FIG. 11) projecting toward the circuit board 7, the fan-side terminals 7bb projecting toward the fan connector 8a, and a plate-shaped part 7bc that lies between the board-side terminals 7ba and the fan-side terminals 7bb and that supports the terminals 7ba and 7bb.

It is preferable that the board-side terminals 7ba be connected to the surface of the circuit board 7 or inserted into through-holes 7d of the circuit board 7 and be fitted and electrically connected to the circuit board 7 by, for example, press fitting or spot flow soldering. It is preferable that the fan-side terminals 7bb be fitted and electrically connected to the fan connector 8a when the subassembly 48 is attached to the housing 2.

The plate-shaped part 7bc covers the through-hole 21b and is in contact with the base 21. It is preferable that on a surface of the plate-shaped part 7bc that faces the base 21, a groove 7bd be formed along the circumferential direction of a box-shaped member 7be in which the fan-side terminals 7bb are housed and that the sealing material 6a be applied to the groove 7bd.

The sealing material 6a (see FIG. 3) is identical in material composition with the sealing material 6, and closes a gap between the through-hole 21b of the base 21 and the plate-shaped part 7bc. This prevents entry of water or dust into the housing 2 through the gap between the through-hole 21b of the base 21 and the plate-shaped part 7bc.

Figure 12:
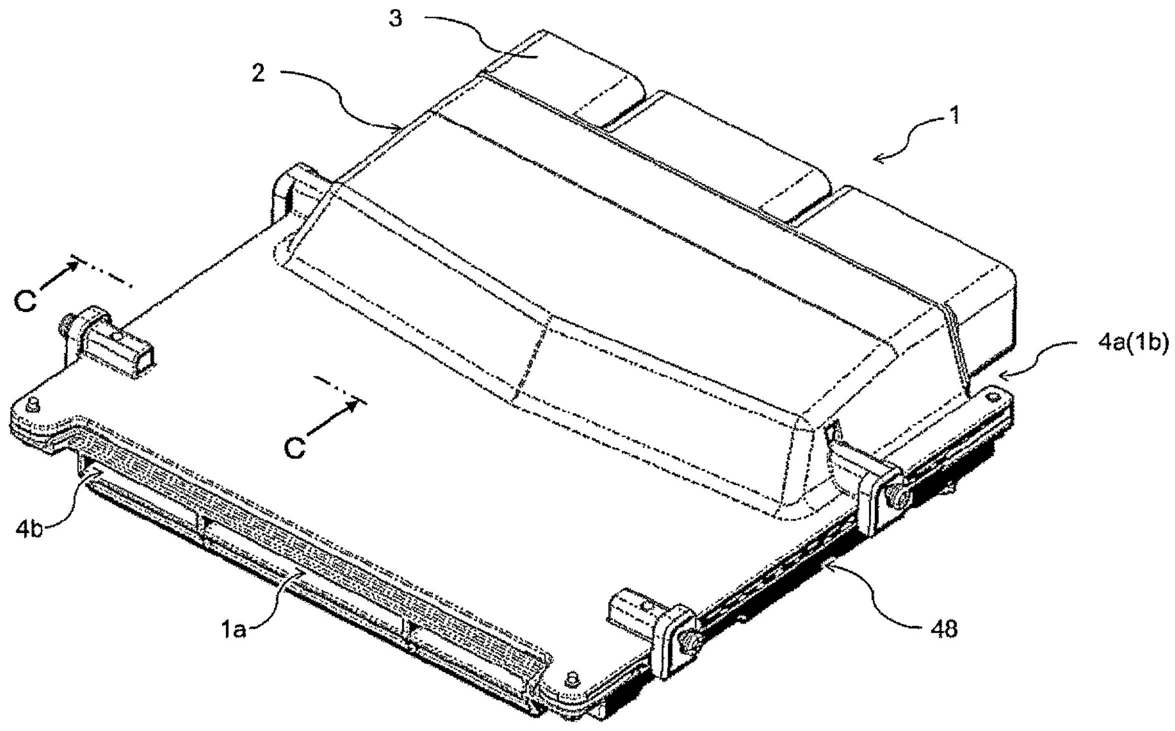
FIG. 12 is a perspective view of an air intake port side of the electronic controller 1 according to the first embodiment of the present invention.

FIG. 12 is a perspective view of an air intake port 1a side of the electronic controller 1 according to the first embodiment of the present invention. It is preferable that the fan 8 be disposed downstream to the plurality of radiation fins 21a in the cooling air channel. When the fan 8 is disposed in this manner, an opening 4b on the side of the plurality of radiation fins 21a serves as the air intake port 1a, and an opening 4a on the opposite side to the external connection connector 3 serves as an exhaust port 1b.

Figure 13:
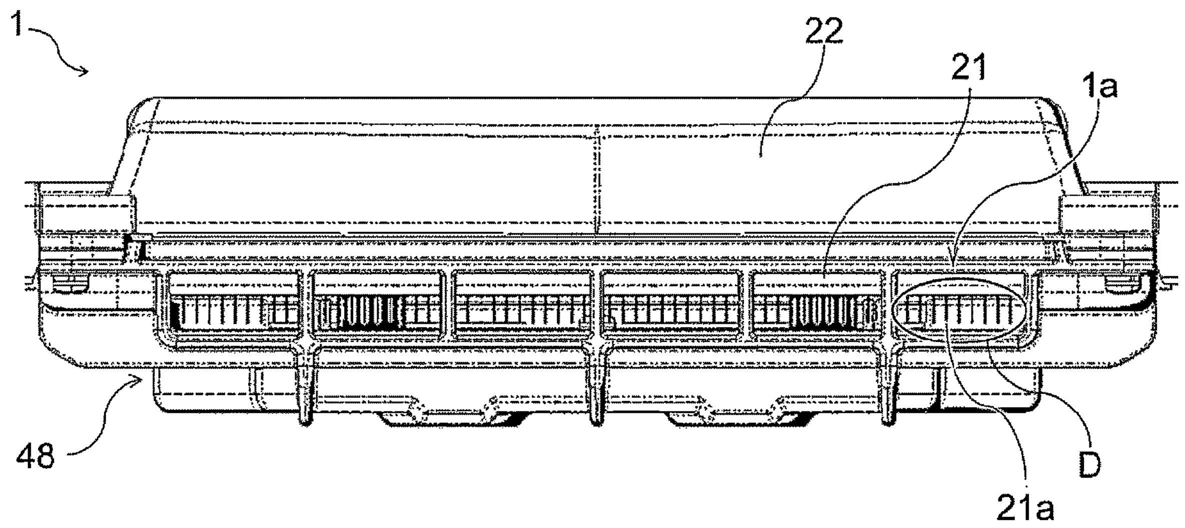
FIG. 13 is a front view of the air intake port side of the electronic controller according to the first embodiment of the present invention.

FIG. 13 is a front view of the air intake port 1a side of the electronic controller 1 according to the first embodiment of the present invention. As shown in FIG. 13, the plurality of radiation fins 21a in the channel can be seen from the air intake port 1a. In other words, the plurality of radiation fins 21a are near the air intake port 1a.

Figure 14:
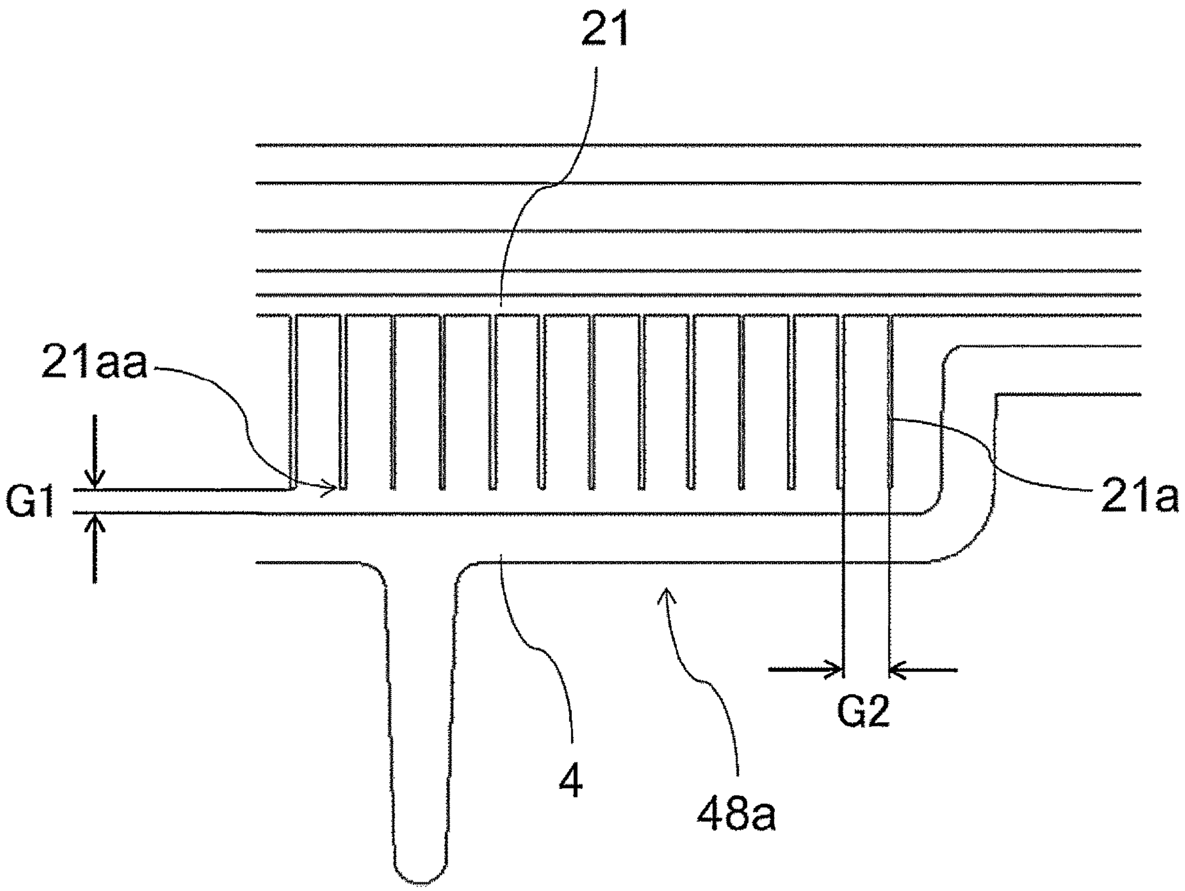
FIG. 14 is an enlarged view of a part D shown in FIG. 13.

FIG. 14 is an enlarged view of a part D shown in FIG. 13. It is preferable that, as shown in FIG. 14, a gap G1 be formed between the air duct 4 and front ends 21aa of the plurality of radiation fins 21*a*. It is also preferable that the size of the gap G1 be set so that a flow rate of cooling air flowing through the gap between the air duct 4 and the front ends 21*aa* of the plurality of radiation fins 21*a* becomes smaller than a flow rate of cooling air flowing through a gap G2 between two adjacent radiation fins 21*a* among the plurality of radiation fins 21*a*.

Figure 15:
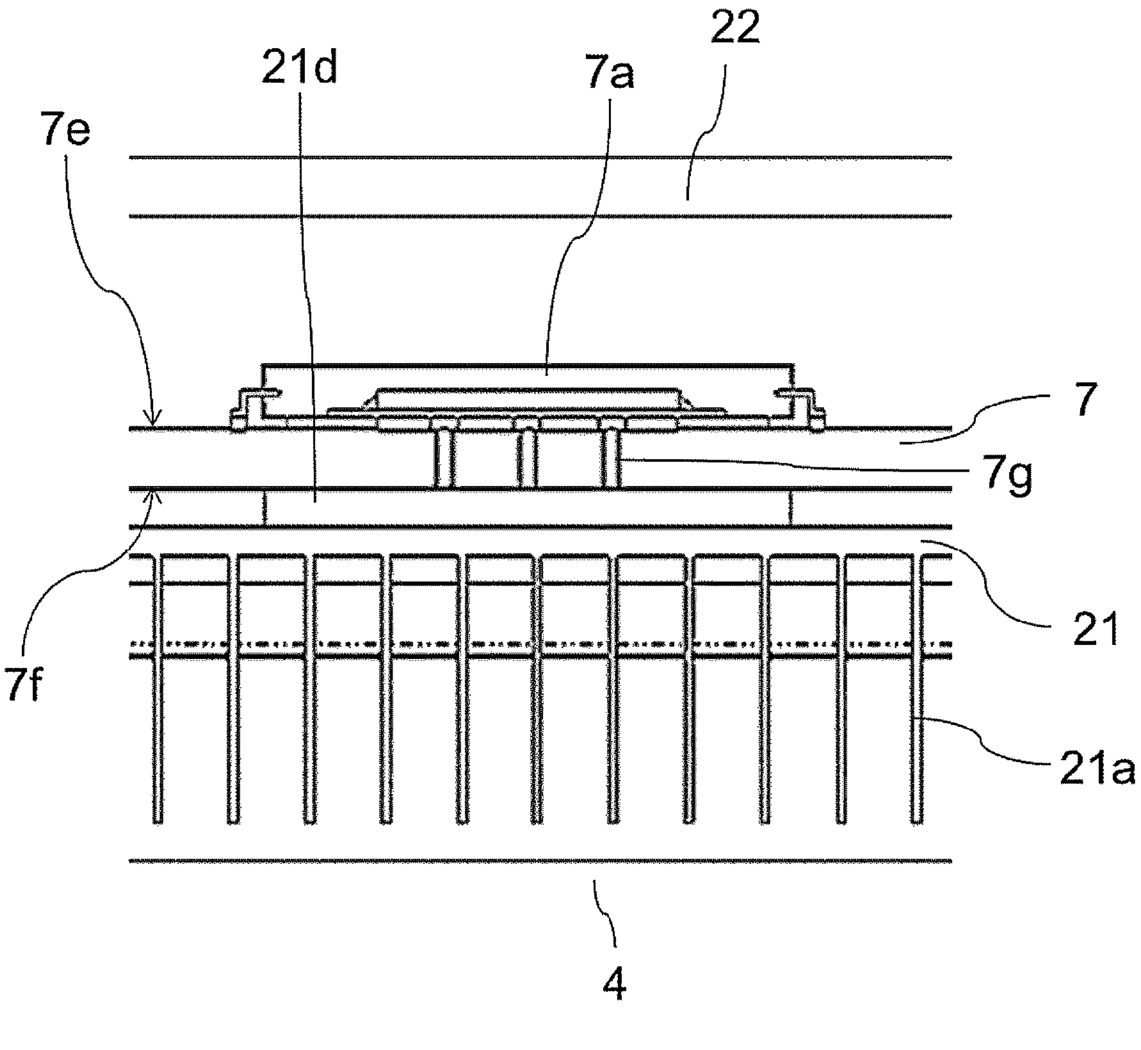
FIG. 15 is a sectional view taken along a line C-C in FIG. 12.

FIG. 15 is a sectional view taken along a line C-C in FIG. 12. It is preferable that the electronic component 7*a* be heat-conductively connected to the plurality of radiation fins 21*a* via thermal vias 7*g*, which are thermal conductors connecting a board surface 7*e* and a back surface 7*f* of the circuit board 7, and heat-dissipating grease 21*d* applied between the circuit board 7 and the housing 2 (base 21).

Effects

In the electronic controller 1 of this embodiment, the fan 8 and the fan connector 8*a* are fixed to the air duct 4 to form the subassembly 48. Therefore, by attaching the subassembly 48 to the housing 2 and electrically connecting the feeder connector 7*b* and the fan connector 8*a* to each other, the fan 8 can be incorporated in the electronic controller 1. This makes a process of incorporating the fan 8 into the electronic controller 1 simpler, thus improving work efficiency.

The circuit board 7 and the fan 8 are electrically connected to each other via the cables 8*c*, the fan connector 8*a*, and the feeder connector 7*b*. Because of this structure, the vibration of the fan 8 is not directly transmitted to the circuit board 7. As a result, a contact failure of the electrical connection part between the blower fan 8 and the circuit board 7, the contact failure being caused by fine sliding wear, can be prevented, and therefore the reliability of electrical connection between the fan 8 and the circuit board 7 can be improved.

In addition, in a case where the air duct 4 is manufactured in conformity to the shapes of the fan 8 and the fan connector 8*a* so that the fan 8 and the fan connector 8*a* can be fixed, the fan 8 and the fan connector 8*a* can be provided as general-purpose products, which allows a reduction in the manufacturing cost.

It is preferable that in the electronic controller 1 of this embodiment, the fan 8 be disposed downstream to the plurality of radiation fins 21*a* in the cooling air channel. This allows cooling air to flow through between individual pairs of adjacent radiation fins 21*a* of the plurality of radiation fins 21*a*, thus allowing an improvement in the cooling performance. In addition, designing a channel for uniformly sending cooling air to the entire electronic controller becomes easy.

It is also preferable that in the electronic controller 1 of this embodiment, the fan 8 be a blower fan. Because the blower fan is thin, using the blower fan can prevent an increase in the thickness of the electronic controller 1.

It is also preferable that the electronic controller 1 of this embodiment include the gap G1 formed between the front ends 21*aa* of the plurality of radiation fins 21*a* and the air duct 4. This prevents a case where the front ends 21*aa* of the plurality of radiation fins 21*a* butt against the air duct 4 due to an assembly error or the like, thus suppressing deformation of the plurality of radiation fins 21*a*. It is also preferable that the size of the gap G1 be set so that the flow rate of cooling air flowing through the gap between the air duct 4 and the front ends 21*aa* of the plurality of radiation fins 21*a* becomes smaller than the flow rate of cooling air flowing through the gap G2 between two adjacent radiation fins 21*a* among the plurality of radiation fins 21*a*. This reduces the amount of a gas flowing through the gap G1 between the air duct 4 and the front ends 21*aa* of the plurality of radiation fins 21*a*, the gas not contributing to cooling, and increases the amount of a gas flowing through the gap G2 between two adjacent radiation fins 21*a* among the plurality of radiation fins 21*a*, the gas contributing to cooling, and therefore allows an improvement in the cooling efficiency.

It is preferable that the electronic controller 1 of this embodiment include the attachment surface limiting structures 4*g* that limit the attachment surface of the fan 8. This prevents a case where the fan 8 is attached to the air duct 4, with the attachment surface set at a wrong position. Labor the work of attaching the fan 8 to the air duct 4 requires, therefore, can be reduced, and the occurrence of a product failure can be suppressed.

It is preferable that in the electronic controller 1 of this embodiment, the fan connector 8*a* and the air duct 4 be provided with the latch mechanism (the latch locking part 8*aa* and the latch engagement part 4*db*) that couples the fan connector 8*a* and the air duct 4 to each other. This allows the fan connector 8*a* to be easily attached and fixed to the air duct 4, thus allowing an improvement in the work efficiency.

It is preferable that in the electronic controller 1 of this embodiment, the cable 8*c* be 5 cm to 15 cm in length. This makes the work of connecting the cable 8*c* to the connector easy, thus allowing an improvement in the work efficiency.

It is preferable that in the electronic controller 1 of this embodiment, the air duct 4 be provided with the cable storage portion 4*e* in which the cables 8*c* are stored. This allows the extra length parts of the cables 8*c* to be easily stored in the cable storage portion 4*e*, thus allowing an improvement in the work efficiency. In addition, when the subassembly 48 is attached to the housing 2, the cables 8*c* being sandwiched between the air duct 4 and the housing 2 is prevented and therefore damaging the cables 8*c* is prevented.

It is preferable that in the electronic controller 1 of this embodiment, the feeder connector 7*b* be attached to the circuit board 7. This connects the feeder connector 7*b* to the circuit board 7 at the shortest distance, thus allowing an improvement in electrical connection reliability.

It is preferable that in the electronic controller 1 of this embodiment, the feeder connector 7*b* be inserted into the through-hole 21*b* formed on the housing 2 (base 21) and the sealing material 6*a* be disposed in the gap formed between the through-hole 21*b* and (the plate-shaped part 7*bc* of) the feeder connector 7*b*. In this structure, the gap between the through-hole 21*b* of the base 21 and the plate-shaped part 7*bc* can be waterproofed by the sealing material 6*a*. As a result, a waterproof structure of the housing can be achieved.

It is preferable that the electronic controller 1 of this embodiment include the temperature sensor (e.g., the temperature sensor incorporated in the electronic component 7*a* mounted on the circuit board 7) and that the rotating speed of the fan 8 be controlled based on a detection value from the temperature sensor. Because of this, the rotating speed of the fan 8 can be controlled based on the temperature of an area around the temperature sensor (the temperature of an area around the electronic component 7*a* when the temperature sensor is incorporated in the electronic component 7*a*) included in the electronic controller 1. In a low temperature condition, for example, the rotating speed of the fan 8 can be reduced and therefore overall noise can be reduced.

The electronic controller 1 of this embodiment including the sealing material 6*a* disposed in the gap between the feeder connector 7*b* and the housing 2 may further include the sealing material 6 disposed between the base 21 and the cover 22 and between the set of the base 21 and the cover 22 and the external connection connector 3, and the potting material applied to the electrical connection part between the fan connector 8*a* and the cables 8*c*. In this electronic controller 1, the fan 8 may be a waterproof fan. This makes the electronic controller 1 waterproof and therefore allows the electronic controller 1 to be mounted outside the vehicle interior.

In the electronic controller 1 of this embodiment, the electronic component 7*a* mounted on the circuit board 7 is heat-conductively connected to the plurality of radiation fins 21*a* via the thermal vias 7*g* connecting the board surface 7*e* and the back surface 7*f* of the circuit board 7 and the heat-dissipating grease 21*d* applied between the circuit board 7 and the housing 2 (base 21). As a result, heat from the electronic component 7*a* can be released out of the electronic controller 1 by cooling air flowing through the air duct 4 via the thermal vias 7*g*, the heat-dissipating grease 21*d*, and the plurality of radiation fins 21*a*. Heat dissipation performance, therefore, can be improved.

It is preferable that in the electronic controller 1 of this embodiment, the projection 8*ac* projecting toward the bottom surface 4*dc* be formed on the bottom surface Bae of the fan connector 8*a* (the surface of the fan connector 8*a* that faces the slot 4*da*) along the slot 4*da*, the bottom surface 8*ae* being in contact with the pair of supports 4*de*. It is also preferable that the plurality of cables 8*c* led out of the bottom surface 8*ae* be arranged along the slot 4*da* by the projection 8*ac*. This prevents entanglement of the plurality of cables 8*c*. Even if, because of a manufacturing error or the like, the fan connector 8*a* is inserted into the slot 4*da* without coming in contact with the pair of supports 4*de* of the connector fixing portion 4*d*, the front end of the projection Bac comes in contact with the bottom surface 4*dc* of the slot 4*da*. This prevents a case where the plurality of cables 8*c* arranged in the slot 4*da* are sandwiched between the bottom surface Bae of the fan connector 8*a* and the bottom surface 4*dc* of the slot 4*da*. In addition, a gap is formed between the front end of the projection Bac and the bottom surface 4*dc* of the slot 4*da*. As a result, the plurality of cables 8*c* can be arranged along the slot 4*da* by the projection 8*ac*, and the claw 8*ab* can be inserted securely into the latch receiver 4*dc*.

It is preferable that in the electronic controller 1 of this embodiment, the plurality of radiation fins 21*a* are formed by skiving. This improves the cooling performance of the plurality of radiation fins 21*a*, thus allowing an improvement in the cooling performance of the electronic controller 1.

Second Embodiment

Figure 16:
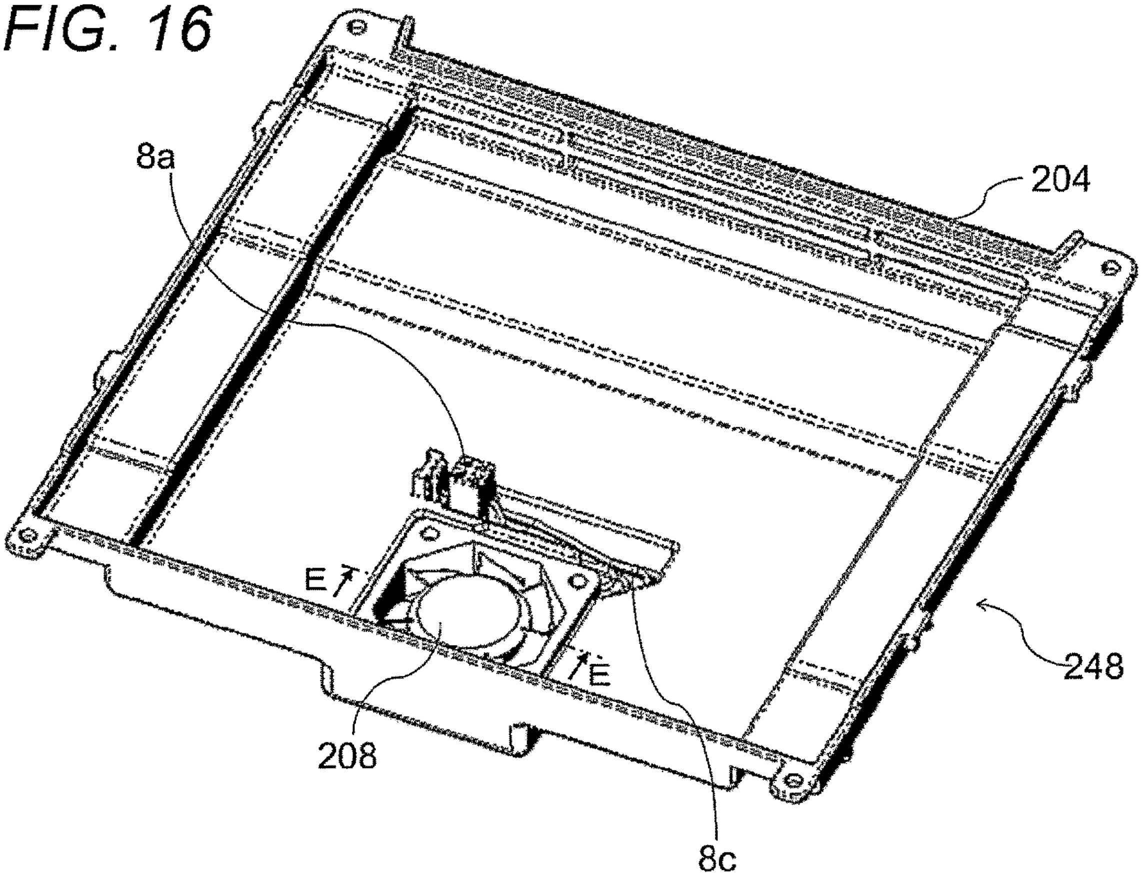
FIG. 16 is a perspective view of a subassembly according to a second embodiment of the present invention.

FIG. 16 is a perspective view of a subassembly 248 according to a second embodiment of the present invention. The subassembly 248 according to the second embodiment is different from the subassembly 48 according to the first embodiment in that the fan used is an axial fan 208.

Figure 17:
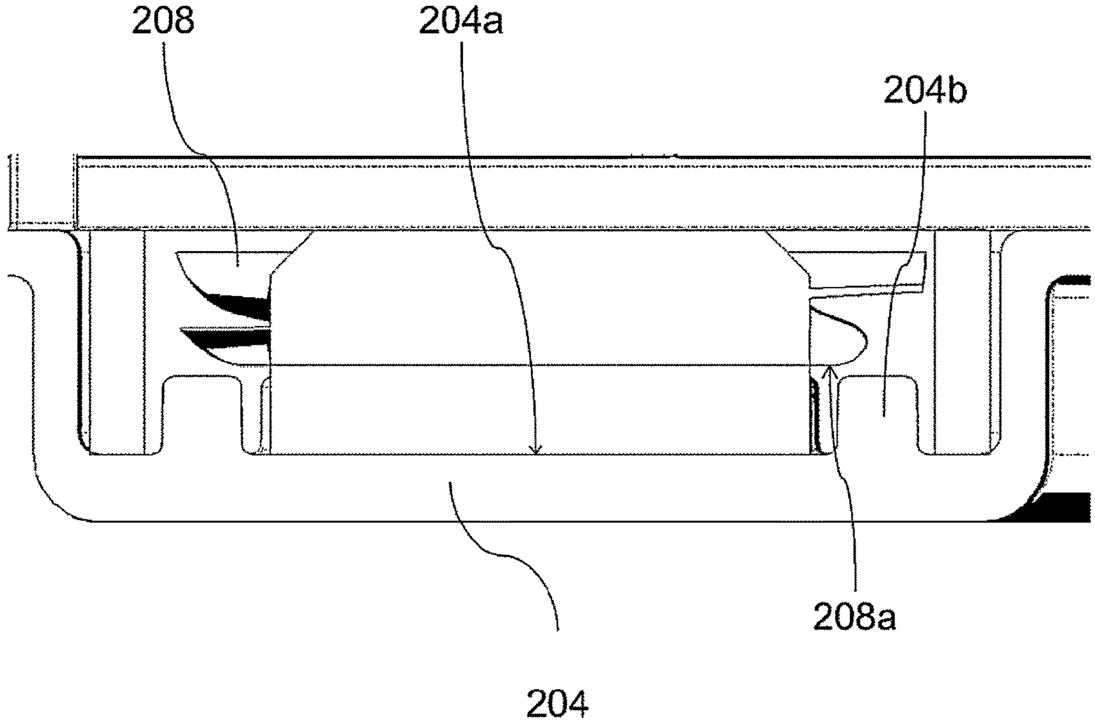
FIG. 17 is a sectional view taken along a line E-E in FIG. 16.

FIG. 17 is a sectional view taken along a line D-D in FIG. 16. As shown in FIG. 17, an air duct 204 according to the second embodiment of the present invention is provided with attachment surface limiting structures 204*b* projecting from a bottom surface 204*a* of an attachment part of the axial fan 208 to the vicinity of lower ends 208*a* of the vanes of the axial fan 208.

Figure 18:
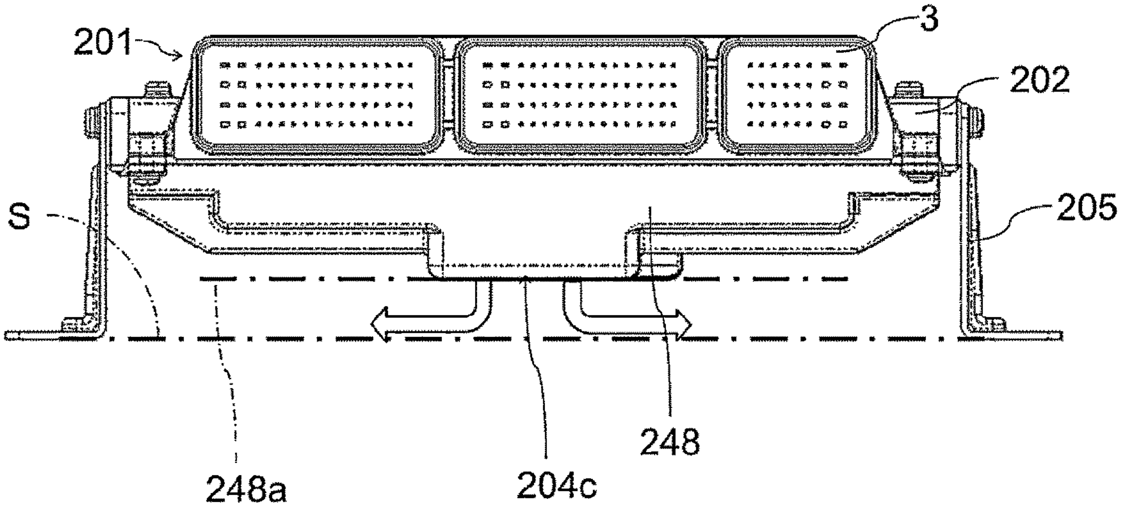
FIG. 18 is a front view of a connector side of an electronic controller according to the second embodiment of the present invention.

FIG. 18 is a front view of the external connection connector 3 side of an electronic controller 201 according to the second embodiment of the present invention. As shown in FIG. 18, a housing 202 is fitted with brackets 205 for attaching an electronic controller 201 to an attachment target S. The brackets 205 hold the distance between an exhaust port 204*c* of the air duct 204 and the attachment target S at a given value of, for example, approximately 15 mm or more.

Effects

In the electronic controller 201 of this embodiment, the fan is the axial fan 208. The axial fan 208 increases the volume of cooling air, thus improving the cooling performance.

The air duct 204 of this embodiment is provided with the attachment surface limiting structures 204*b*. As a result, if the axial fan 208 with its attachment surface in a wrong position is attached to the air duct 204, the attachment surface limiting structures 204*b* interfere with the vanes of the axial fan 208, which renders the axial fan 208 incapable of rotating. This prevents a case where the axial fan 208 with its attachment surface in a wrong position is attached to the air duct 204. Hence labor the work of attaching the axial fan 208 to the air duct 204 requires can be reduced and occurrence of a product failure can be suppressed.

It is preferable that the electronic controller 201 of this embodiment include the fan provided as the axial fan 208 and further include the brackets 205 for attaching the electronic controller 201 to the attachment target S, and that the brackets 205 hold the distance between the exhaust port 204*c* of the air duct 204 and the attachment target S at the given value (e.g., 15 mm or more which is the distance that does not hamper air discharge by the axial fan 208). This provides the distance that does not hamper air discharge by the axial fan 208, between an installation surface S and the exhaust port of the axial fan 208. As a result, the idling of the axial fan can be prevented.

Third Embodiment

Figure 19:
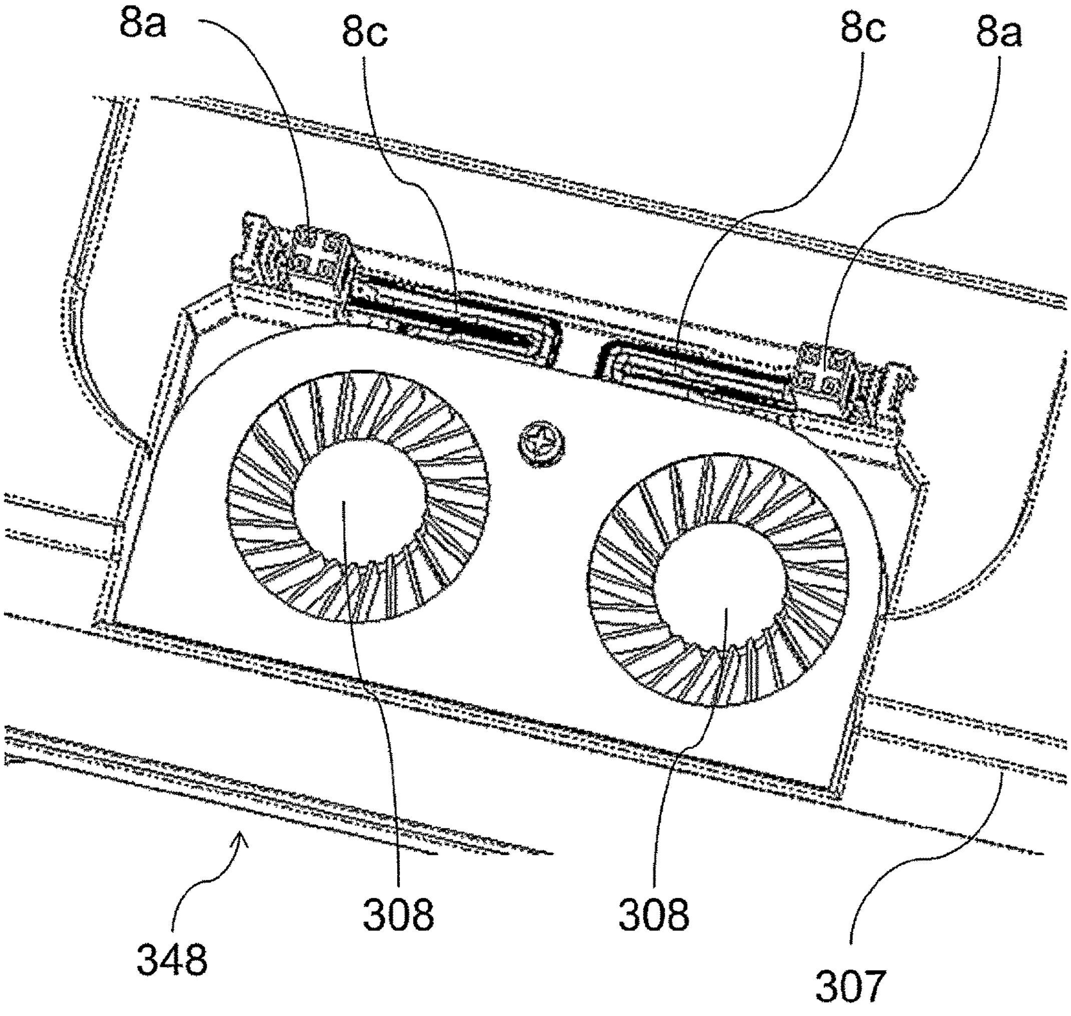
FIG. 19 is an enlarged perspective view of fans 308 included in a subassembly according to a third embodiment of the present invention.

FIG. 19 is an enlarged perspective view of fans 308 included in a subassembly 348 according to a third embodiment of the present invention. The electronic controller according to the third embodiment is different from the electronic controller 1 according to the first embodiment in that an air duct 304 is provided with a plurality of the fans 8 (two fans in FIG. 19) and that even if any one of the plurality of fans 8 fails, the remaining normal fan(s) 8 run(s) continuously. FIG. 19 shows the embodiment in which the blower fans 8 are used as the fans 308. However, the third embodiment is not limited to this case, and a plurality of the axial fans 208 may be used as the fans 308.

Effects

It is preferable that in the electronic controller of this embodiment, the fans 8 be the plurality of fans 8 and that even if any one of the plurality of fans 8 fails, the remaining normal fan(s) 8 run continuously. Even if one fan 8 fails, the other fans 8 keep rotating. The cooling function, therefore, can be maintained.

Fourth Embodiment

Figure 20:
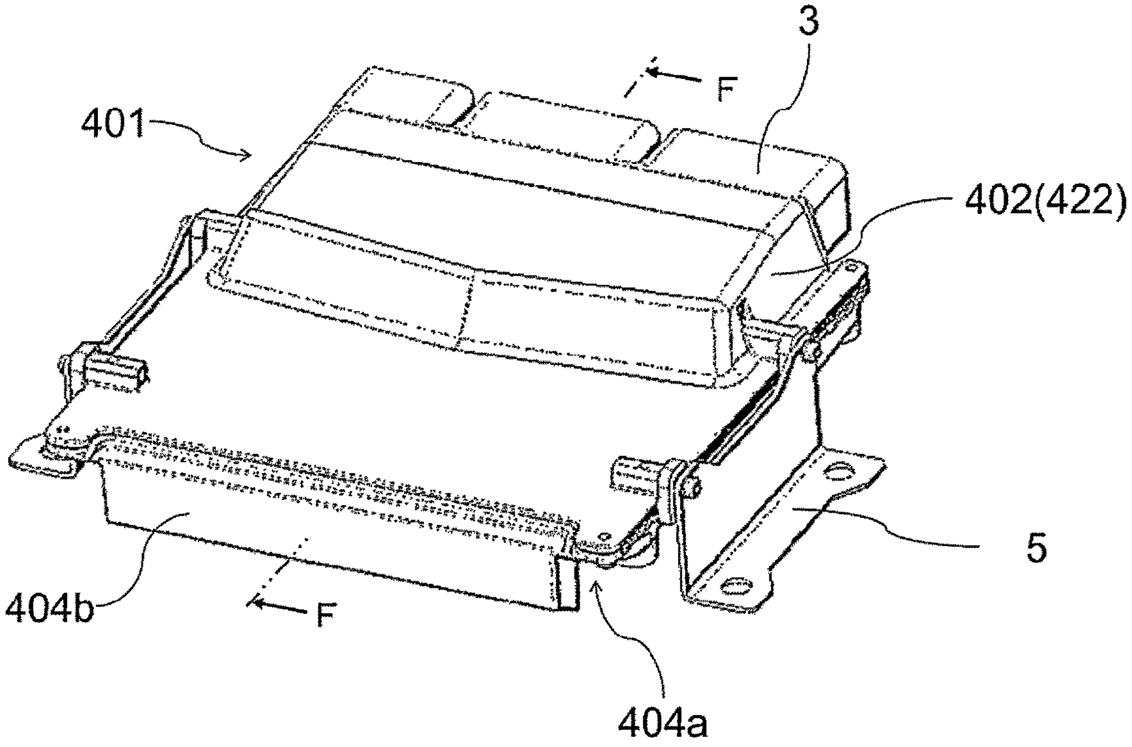
FIG. 20 is a perspective view of a blind portion side of an electronic controller according to a fourth embodiment of the present invention.
Figure 21:
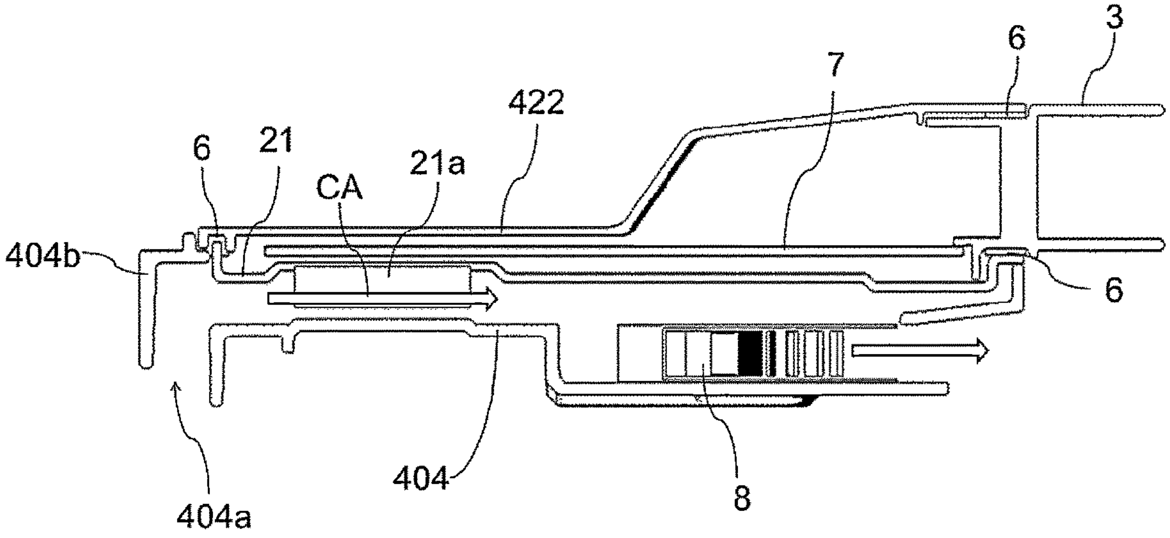
FIG. 21 is a sectional view taken along a line F-F in FIG. 20.
Figure 22:
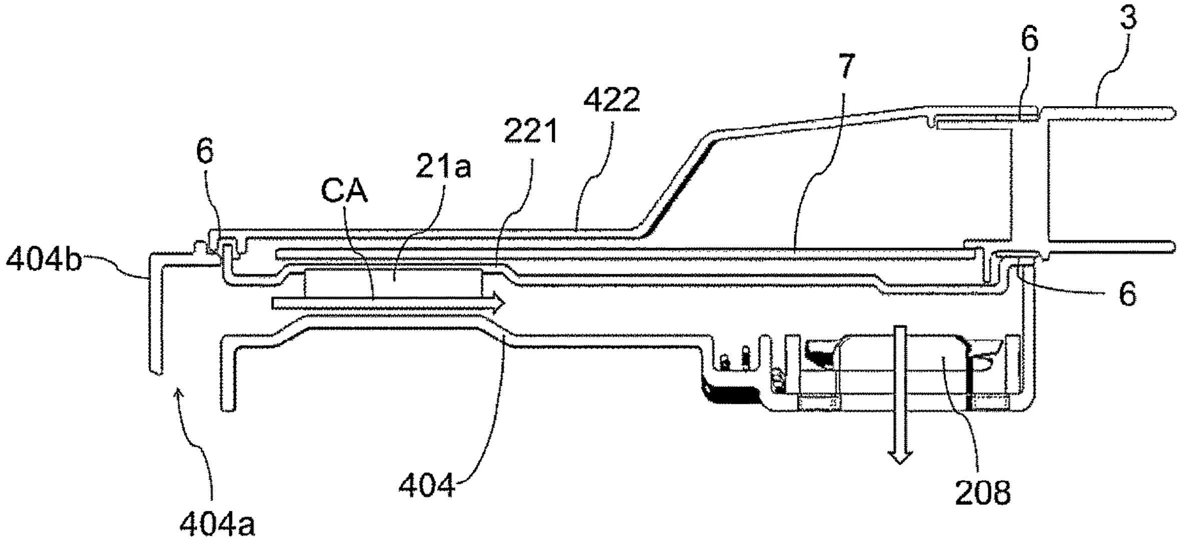
FIG. 22 is a sectional view taken along the line F-F in FIG. 20.

FIG. 20 is a perspective view of a blind portion 404*b* side of an electronic controller 401 according to a fourth embodiment of the present invention. FIGS. 21 and 22 are sectional views each taken along a line F-F in FIG. 20.

It is preferable that, different from the electronic controller 1 according to the first embodiment, the electronic controller 401 according to the fourth embodiment include a blind portion 404*b* on an air duct 404, the blind portion 404*b* masking out a plurality of radiation fins 21*a* to make them invisible, as shown in FIG. 20. It is preferable, as shown in FIGS. 21 and 22, that an air intake port 404*a* of the air duct 404 of this embodiment be open in a direction different from the direction of cooling air CA flowing through gaps between a plurality of radiation fins 21*a*. Thus, the blind portion 404*b* that masks out the plurality of radiation fins 21*a* is formed on the air duct 404. In addition, it is particularly preferable that the air intake port 404*a* be open in the direction perpendicular to the direction of a cooling air flow on the side opposite to a cover 422 with respect to the cooling air flow.

FIG. 21 shows an embodiment where the blower fan 8 is used, and FIG. 22 shows an embodiment where the axial fan 208 is used.

Effects

It is preferable that, in the electronic controller 401 according to this embodiment, the air intake port 404*a* of the air duct 404 be open in a direction different from the direction of the cooling air CA flowing through gaps between the plurality of radiation fins 21*a*. It is also preferable that the plurality of radiation fins 21*a* be masked with the blind portion 404*b*. This prevents a case where a foreign object, such as dust and pebbles, is sucked into the air intake port 404*a* and hits the fan 8 or 208 located downstream to the plurality of radiation fins 21*a*. Failure incidents of the fan, therefore, can be reduced.

It is also particularly preferable that the air intake port 404*a* be open in the direction perpendicular to the direction of the cooling air flow on the side opposite to the cover 422 with respect to the cooling air flow. In this case, the opening area of the air intake port 404*a* can be made larger than a case where the air intake port 404*a* is open on a different side, and therefore a drop in the cooling performance can be suppressed.

Fifth Embodiment

Figure 23:
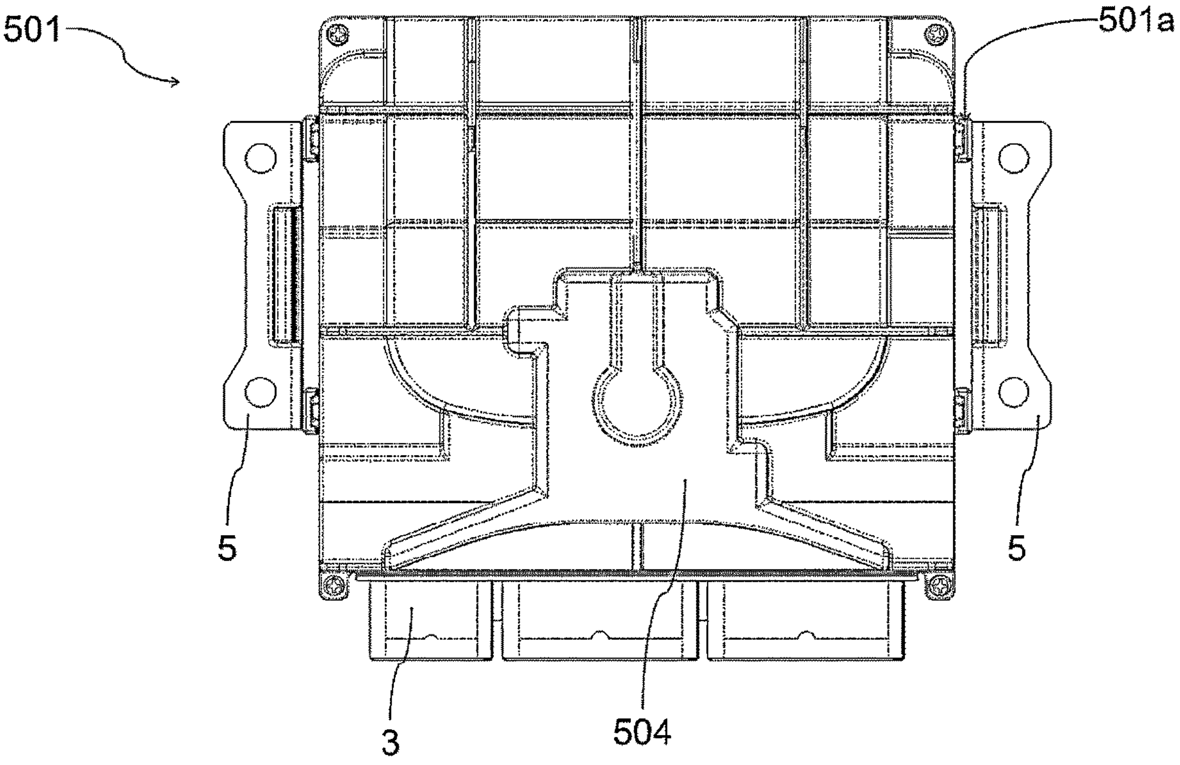
FIG. 23 is a front view of an air duct side of an electronic controller according to a fifth embodiment of the present invention.

FIG. 23 is a front view of an air duct 504 side of an electronic controller 501 according to a fifth embodiment of the present invention. The electronic controller 501 according to the fifth embodiment is different from the electronic controller 1 according to the first embodiment in that the electronic controller 501 includes an attachment position limiting structure 501*a* that, in FIG. 23, limits an attachment position between a housing (not illustrated) on the back of an air duct 504 and the air duct 504.

Figure 24:
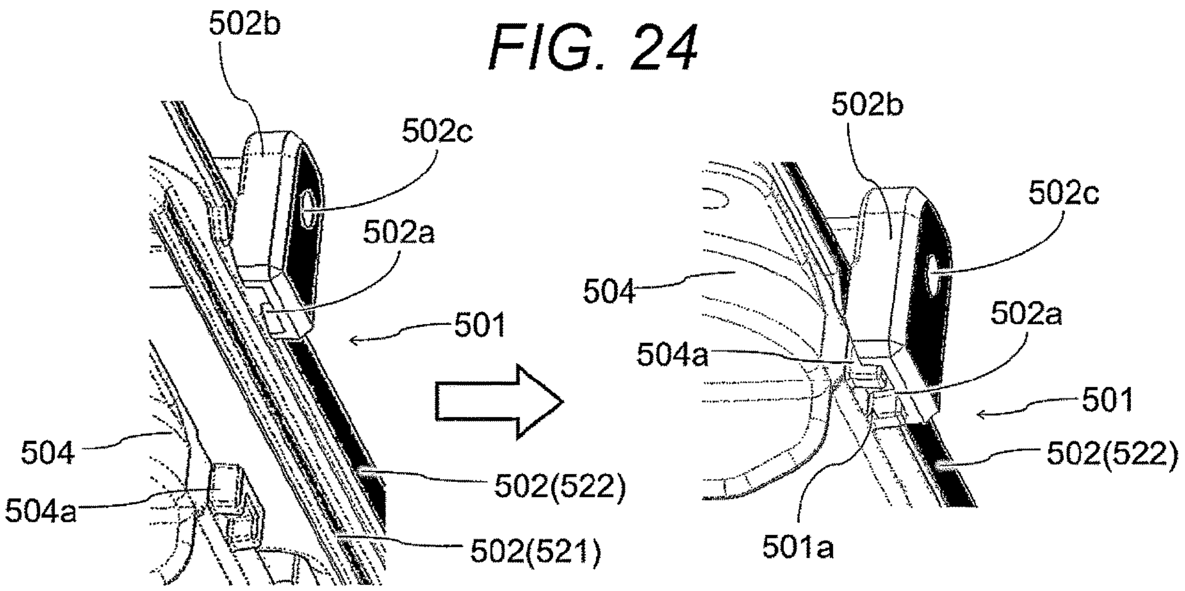
FIG. 24 includes enlarged perspective views of an attachment position limiting structure according to the fifth embodiment of the present invention, showing the attachment position limiting structure before positioning on the left and the attachment position limiting structure after positioning on the right.

FIG. 24 includes enlarged perspective views of the attachment position limiting structure 501*a* of the electronic controller 501 according to the fifth embodiment of the present invention, showing the attachment position limiting structure 501*a* before positioning on the left and the attachment position limiting structure 501*a* after positioning on the right. As shown in FIG. 24, a side surface of the air duct 504 is provided with a protrusion 504*a*. A side surface of the housing 502 is provided with a guide 502*b* having a hole 502*c* that is a screw hole for attaching the bracket 5, and the guide 502*b* is provided with a recession 502*a* opening downward. In other words, the attachment position limiting structure 501*a* (see FIG. 23) includes the protrusion 504*a* and the guide 502*b* having the recession 502*a*. By fitting the protrusion 504*a* into the recession 502*a*, as shown in the figure on the right in FIG. 24, the attachment position between the housing 502 and the air duct 504 is limited.

The attachment position limiting structure 501*a* shown in FIG. 24 is a structure in which the guide 502*b* is formed fabricated by die casting. However, the on a cover 522 attachment position limiting structure 501*a* is not limited to this structure, and may be provided as a structure in which the guide 502*b* is formed on a base 521.

Figure 25:
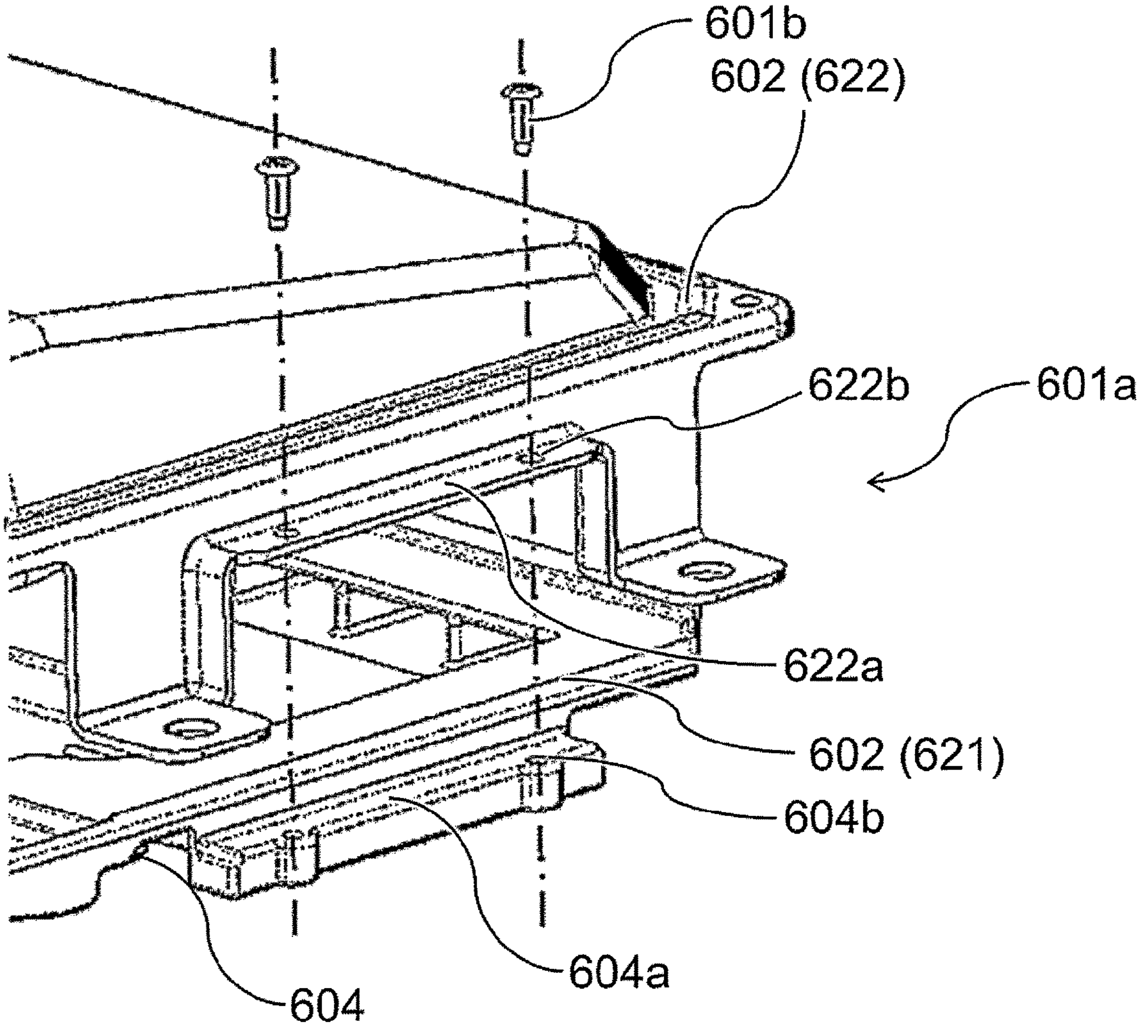
FIG. 25 is an enlarged perspective view of an attachment position limiting structure according to another embodiment of the present invention.

FIG. 25 is an enlarged perspective view of an attachment position limiting structure 601*a* according to another embodiment. As shown in FIG. 25, the attachment position limiting structure 601*a* includes a first projection 622*a* protruding from a side surface of a cover 622 molded by press working, and a second projection 604*a* protruding from a side surface of an air duct 604.

The first projection 622*a* is provided with through-holes 622*b*, and the second projection 604*a* is provided with screw holes 604*b*. The first projection 622*a* and the second projection 604*a* are fitted together and then positioning screws 601*b* are put through the through-holes 622*b* and are screwed down into the screw holes 604*b*. Hence an attachment position between a housing 602 and the air duct 604 is limited. The first projection 622*a* may be formed on the base 621 in the same manner as the guide 502*b* shown in FIG. 24 is formed on the base 521.

Effects

In the electronic controller according to this embodiment, the housings 502 and 602 and the air ducts 504 and 604 are provided with the attachment position limiting structures 501*a* and 601*a* that limit the attachment positions between the housing 502 and 602 and the air ducts 504 and 604, respectively. As a result, when the air ducts 504 and 604 and the housings 502 and 602 are assembled together, the attachment positions between the air ducts 504 and 604 and the housings 502 and 602 can be determined by the attachment position limiting structures 501*a* and 601*a*, respectively. This prevents a problem with coupling of the fan connector 8*a* and the feeder connector 7*b* and a problem of the cables 8*c* being sandwiched between the air duct 504 or 604 and the housing 502 or 602.

It should be noted that the present invention is not limited to the above embodiments but includes various modifications. For example, the above embodiments have been described in detail to give an understandable description of the present invention and are not necessarily limited to an embodiment including all constituent elements described above. Some of constituent elements of one embodiment can be replaced with constituent elements of another embodiment, and a constituent element of another embodiment can be added to a constituent element of one embodiment. Furthermore, some of constituent elements of each embodiment can be deleted or added to or replaced with different constituent elements.

REFERENCE SIGNS LIST

1, 201, 401, 501 electronic controller
1*a* air intake port
2, 502, 602 housing
3 external connection connector
4, 204, 404, 504, 604 air duct
4*c* fan fixing portion
4*d* connector fixing portion
4*db* latch engagement part

4*e* cable storage portion
4*g*, 204*b* attachment surface limiting structure
5, 205 bracket
6, 6*a* sealing material
7 circuit board
7*a* electronic component
7*b* feeder connector
8, 208, 308 fan
8*a* fan connector
8*aa* latch locking part
8*ac* projection
8*ae* bottom surface
8*c* cable
21, 521, 621 base
21*a* radiation fins
21*aa* front end
21*d* heat-dissipating grease
22, 522, 622 cover
48, 248, 348 subassembly
208 axial fan
501*a*, 601*a* attachment position limiting structure

The invention claimed is:

1. An electronic controller comprising: a circuit board; a housing that houses the circuit board; a plurality of radiation fins formed on the housing; an air duct attached to the housing in such a way as to cover the plurality of radiation fins, the air duct forming a channel for cooling air together with the housing and the plurality of radiation fins; a bracket for attaching the electronic controller to an attachment target; a fan that causes cooling air to flow through the channel; a fan connector electrically connected to the fan via a cable; and a feeder connector electrically connected to the circuit board and fixed to the housing, wherein the fan is an axial fan, the bracket holds a distance between an exhaust port of the air duct and the attachment target at a given value, the fan connector is detachably connected to the feeder connector, and the fan and the fan connector are fixed to the air duct.

2. The electronic controller according to claim 1, wherein the fan is disposed downstream to the plurality of radiation fins in the channel.

3. The electronic controller according to claim 1, wherein a size of a gap formed between the air duct and front ends of the plurality of radiation fins is set so that a flow rate of cooling air flowing through the gap between the air duct and the front ends of the plurality of radiation fins is made smaller than a flow rate of cooling air flowing through a gap between two adjacent radiation fins among the plurality of radiation fins.

4. The electronic controller according to claim 1, wherein the housing and the air duct are provided with an attachment position limiting structure that limits an attachment position between the housing and the air duct.

5. The electronic controller according to claim 2, wherein an air intake port of the air duct is open in a direction different from a flowing direction of a gas flowing through gaps between the plurality of radiation fins.

6. The electronic controller according to claim 1, wherein the air duct is provided with an attachment surface limiting structure that limits an attachment surface of the fan.

7. The electronic controller according to claim 1, wherein the fan connector and the air duct are provided with a latch mechanism that couples the fan connector and the air duct to each other.

8. The electronic controller according to claim 1, wherein the cable is 5 cm to 15 cm in length.

9. The electronic controller according to claim 4, wherein the air duct is provided with a cable storage portion in which an extra length part of the cable is stored.

10. The electronic controller according to claim 1, wherein the feeder connector is attached to the circuit board.

11. The electronic controller according to claim 1, wherein the feeder connector is inserted into a through-hole formed on the housing, and a waterproof sealing material is disposed in a gap formed between the through-hole and the feeder connector.

12. The electronic controller according to claim 1, further comprising a temperature sensor, wherein a rotating speed of the fan is controlled based on a detection value from the temperature sensor.

13. The electronic controller according to claim 1, wherein the fan is a plurality of fans, and even if any one of the plurality of fans fails, a remaining normal fan runs continuously.

14. The electronic controller according to claim 11, comprising:

a sealing material disposed between the base and the cover that make up the housing and between a set of the base and the cover and an external connection connector electrically connected to the circuit board; and a potting material applied to an electrical connection part between the fan connector and the cable, wherein the fan is a waterproof fan.

15. The electronic controller according to claim 1, wherein an electronic component mounted on the circuit board is heat-conductively connected to the plurality of radiation fins via a thermal via connecting a board surface and a back surface of the circuit board and heat-dissipating grease applied between the circuit board and the housing.

16. The electronic controller according to claim 1, wherein a fixing portion of the air duct, the fixing portion having the fan connector fixed thereto, is provided with a slot into which the fan connector is inserted, a surface of the fan connector that faces the slot is provided with a projection projecting toward the slot along the slot, and a plurality of cables led out of the surface of the fan connector that faces the slot are arranged along the slot by the projection.

17. The electronic controller according to claim 1, wherein the plurality of radiation fins are formed by skiving.

* * * * *